(12) United States Patent
Yeong et al.

(10) Patent No.: US 11,189,708 B2
(45) Date of Patent: Nov. 30, 2021

(54) SEMICONDUCTOR DEVICE STRUCTURE WITH GATE STACK AND METHOD FOR FORMING THE SAME

(71) Applicant: Taiwan Semiconductor Manufacturing Co., Ltd., Hsinchu (TW)

(72) Inventors: Sai-Hooi Yeong, Zhubei (TW); Chien-Ning Yao, Hsinchu (TW); Chi-On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 67 days.

(21) Appl. No.: 16/656,014

(22) Filed: Oct. 17, 2019

(65) Prior Publication Data

US 2021/0119010 A1  Apr. 22, 2021

(51) Int. Cl.
*H01L 29/51* (2006.01)
*H01L 29/66* (2006.01)
*H01L 29/78* (2006.01)

(52) U.S. Cl.
CPC ...... *H01L 29/515* (2013.01); *H01L 29/66795* (2013.01); *H01L 29/7851* (2013.01)

(58) Field of Classification Search
CPC ............. H01L 29/515; H01L 29/66795; H01L 29/7851
USPC ....................................................... 257/401
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 10,008,578 B1* | 6/2018 | Lee | H01L 29/4991 |
| 2006/0091453 A1* | 5/2006 | Matsuda | H01L 29/66734 257/330 |
| 2013/0320550 A1* | 12/2013 | Kim | H01L 21/76897 257/773 |
| 2015/0243544 A1* | 8/2015 | Alptekin | H01L 29/6653 438/586 |
| 2015/0263122 A1* | 9/2015 | Hsiao | H01L 29/6656 257/401 |

(Continued)

*Primary Examiner* — Dzung Tran
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a first source/drain structure and a second source/drain structure in the substrate. The semiconductor device structure includes a gate stack over the substrate and between the first source/drain structure and the second source/drain structure. The gate stack includes a gate dielectric layer and a gate over the gate dielectric layer, a portion of the gate dielectric layer is adjacent to a first sidewall of the gate, the gate stack has a gap between the first sidewall and the portion of the gate dielectric layer, and the gap is a vacuum gap or an air gap.

20 Claims, 26 Drawing Sheets

(56) References Cited

U.S. PATENT DOCUMENTS

2016/0163816 A1* 6/2016 Yu ..................... H01L 29/785
                                                    438/283
2016/0365426 A1* 12/2016 Ching ................ H01L 29/0847
2017/0345911 A1* 11/2017 Yu ..................... H01L 27/0886
2017/0365659 A1* 12/2017 Cheng ................ H01L 21/283

* cited by examiner

SEMICONDUCTOR DEVICE STRUCTURE WITH GATE STACK AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
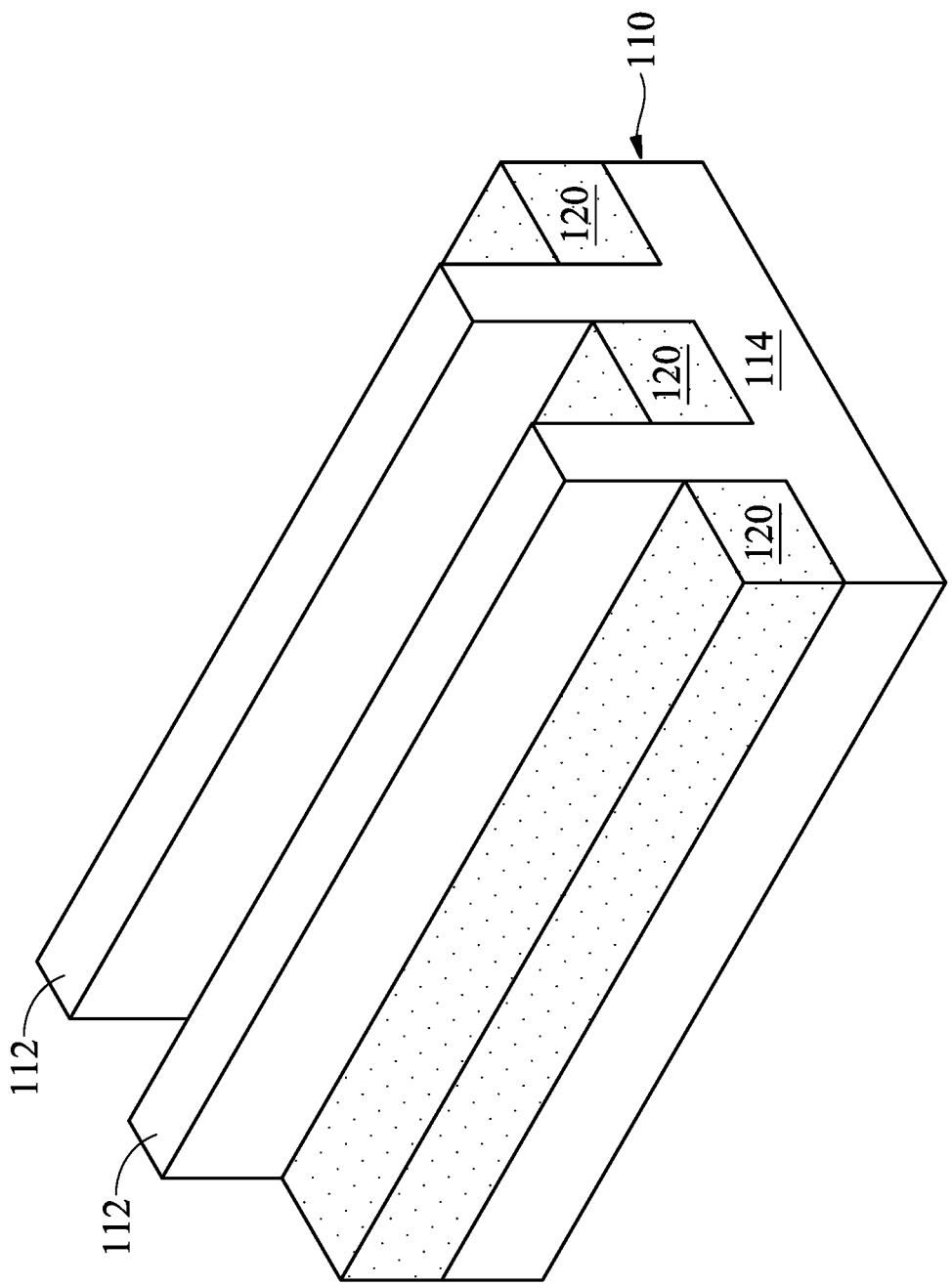
FIGS. 1A-1N are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
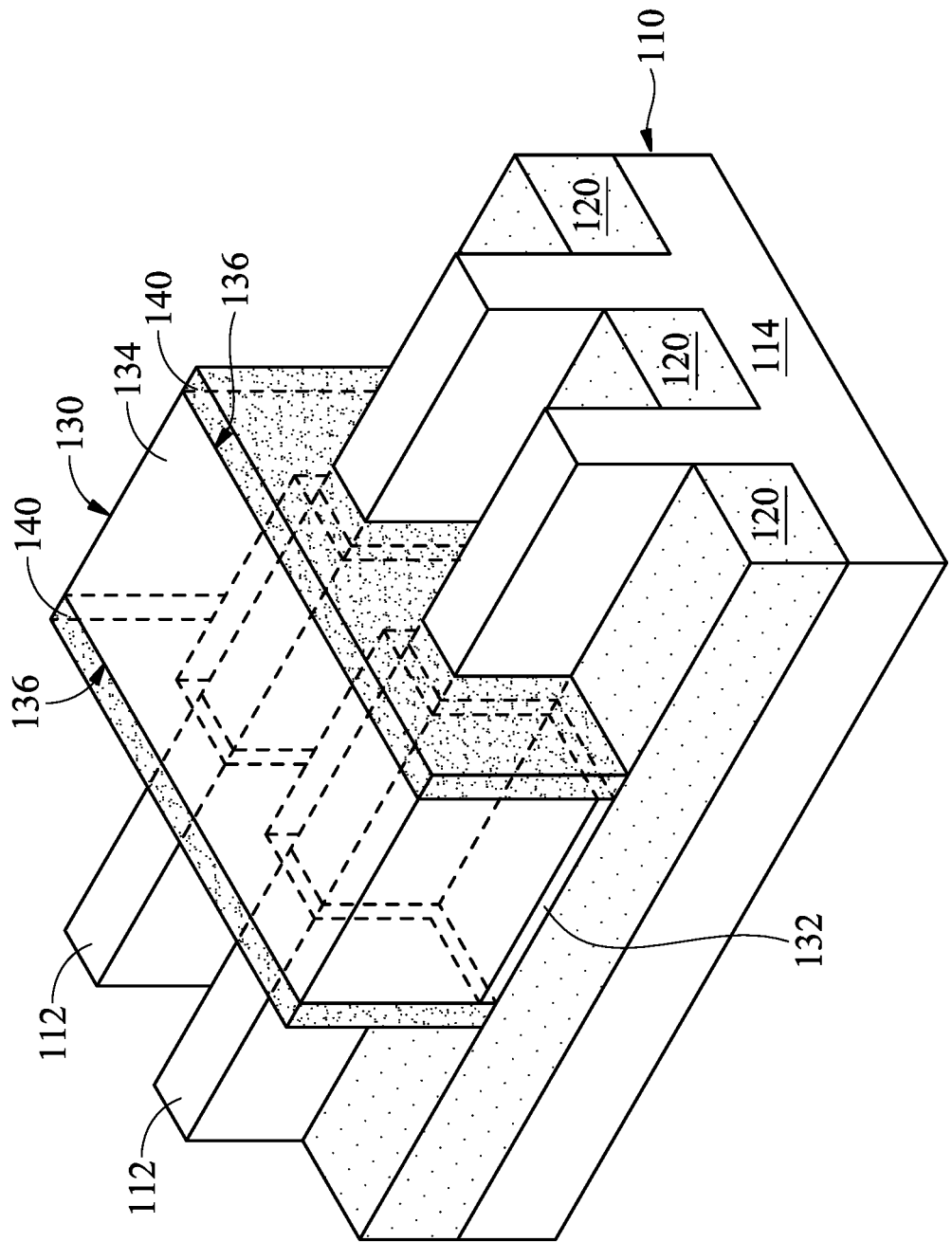
Figure 1C:
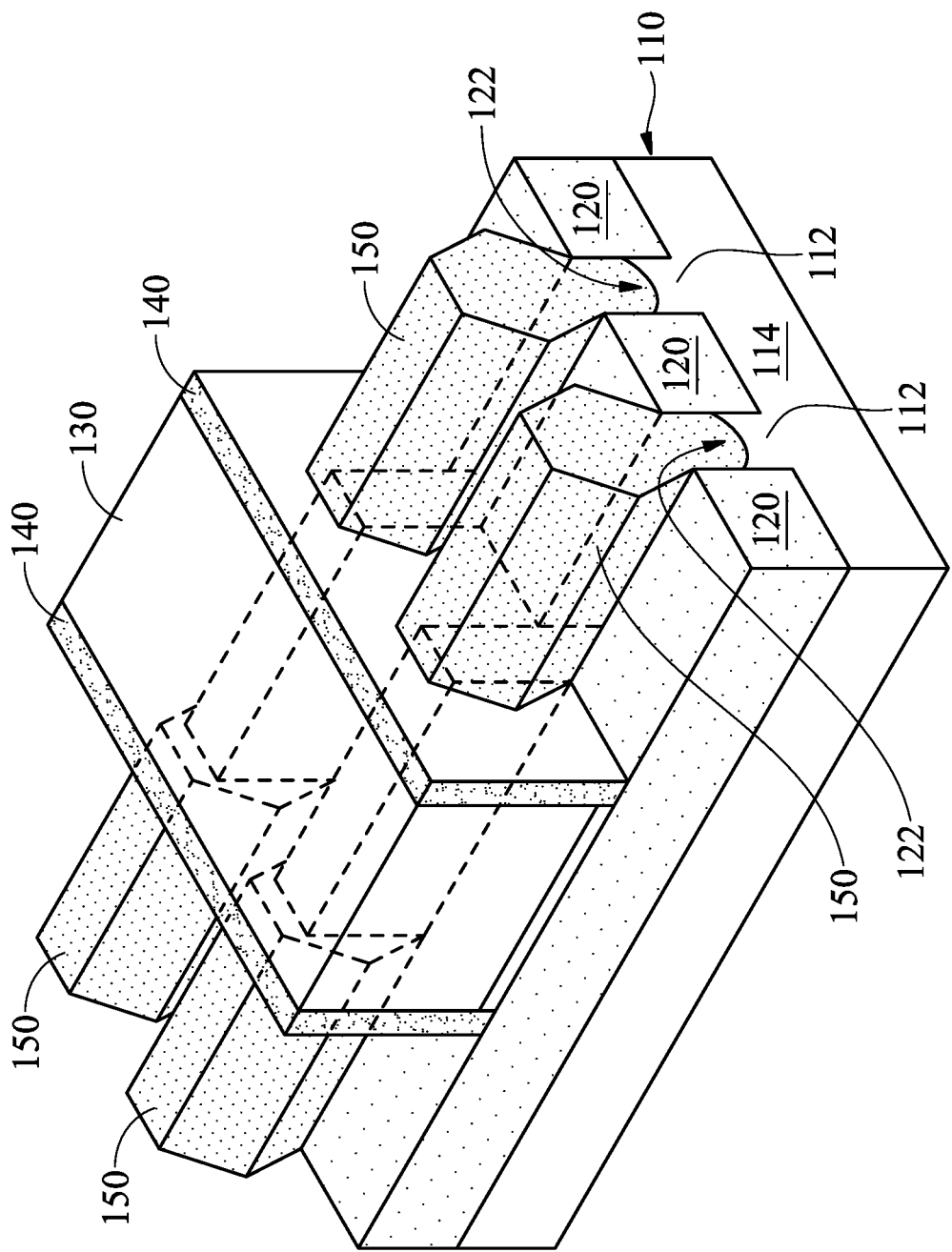
Figure 1D:
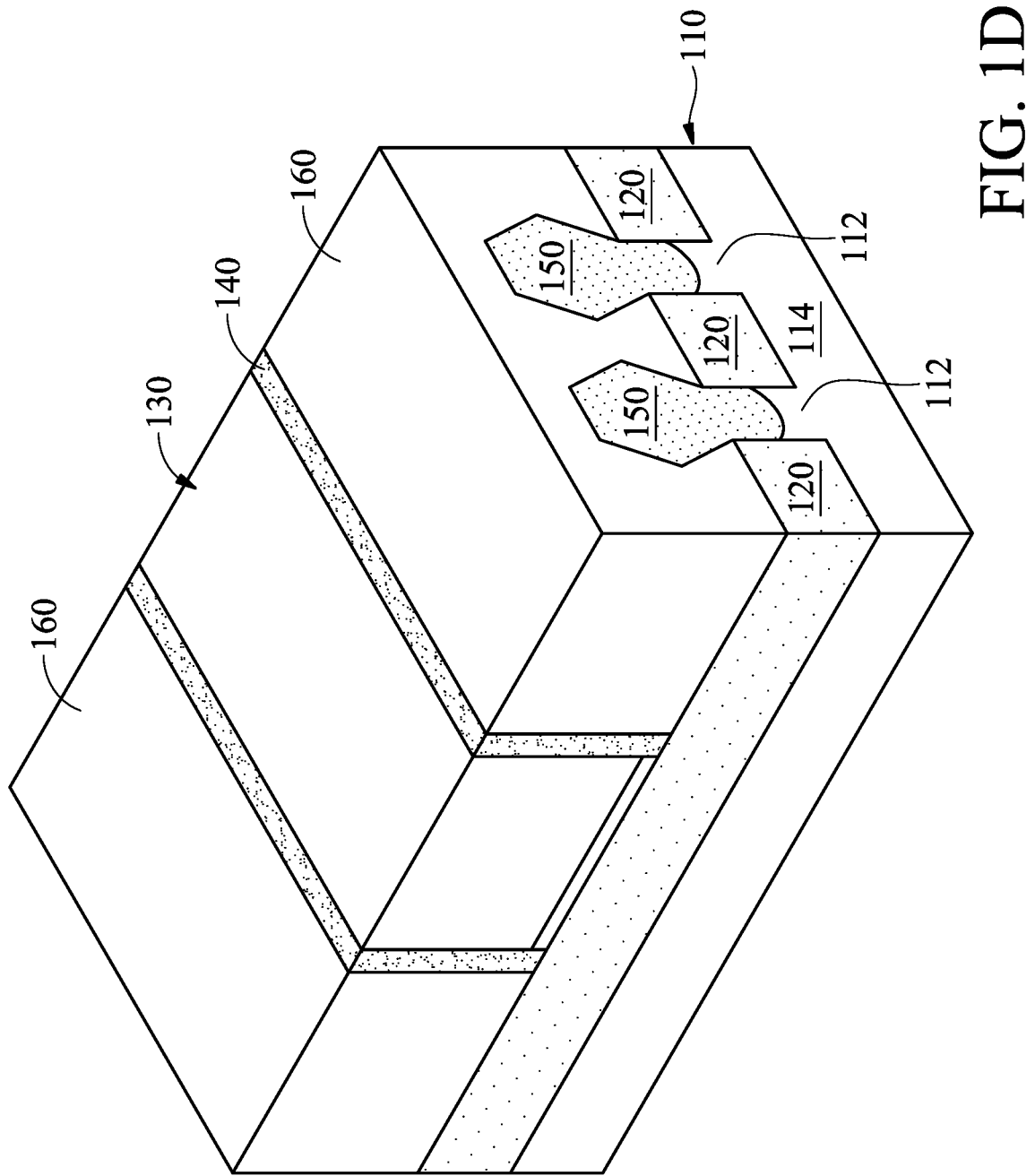
Figure 1E:
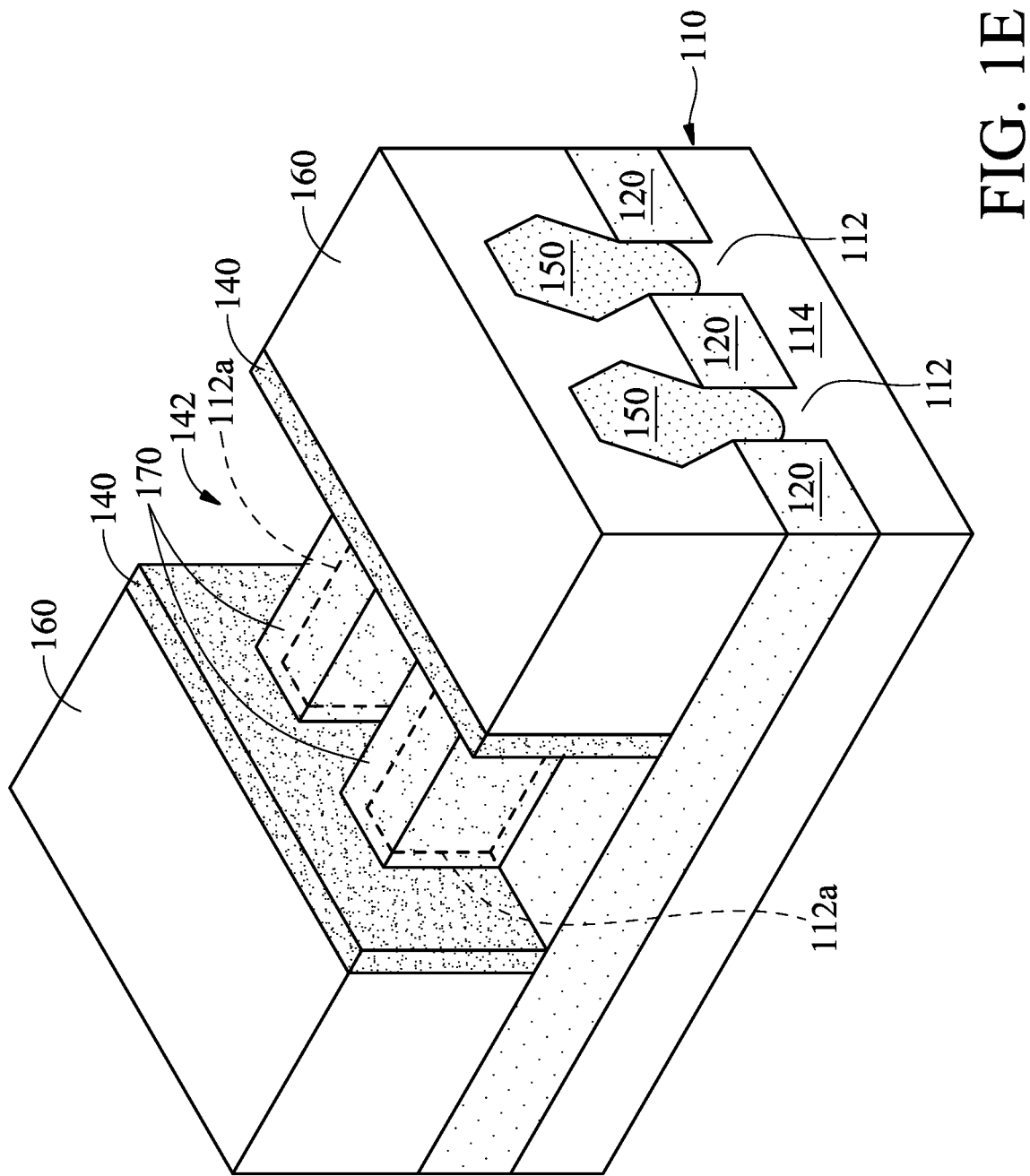
Figure 1F:
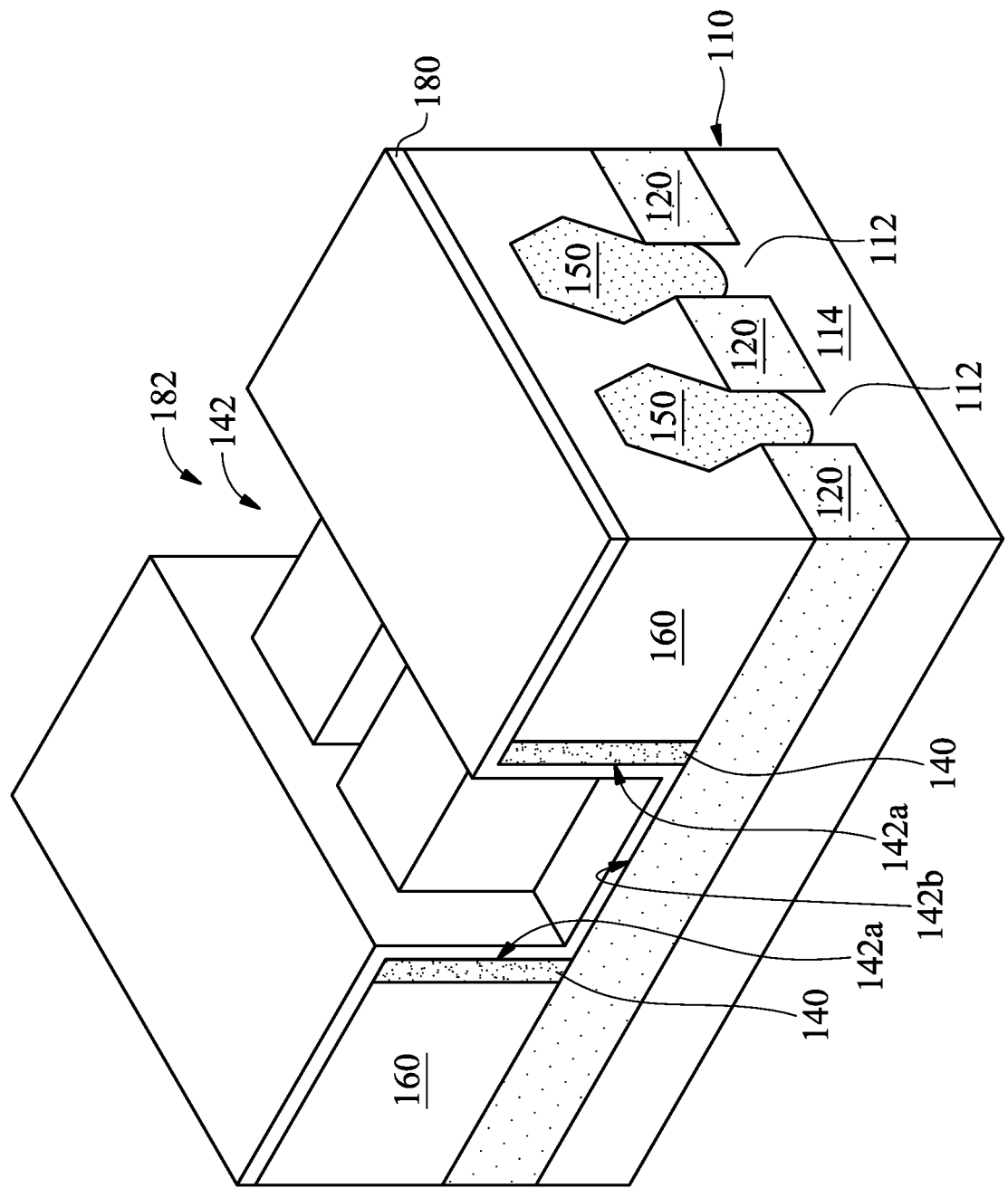
Figure 1G:
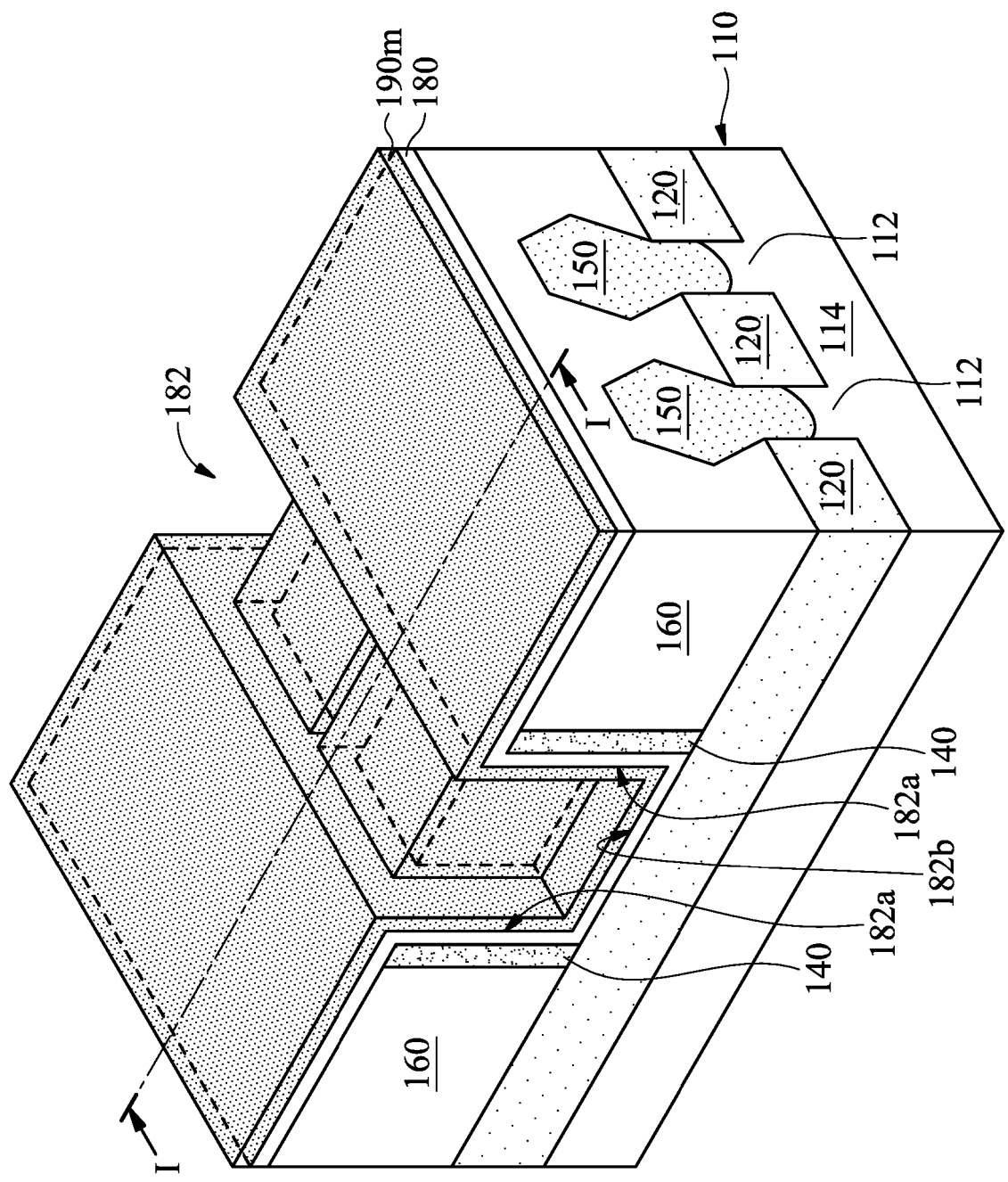
Figure 1H:
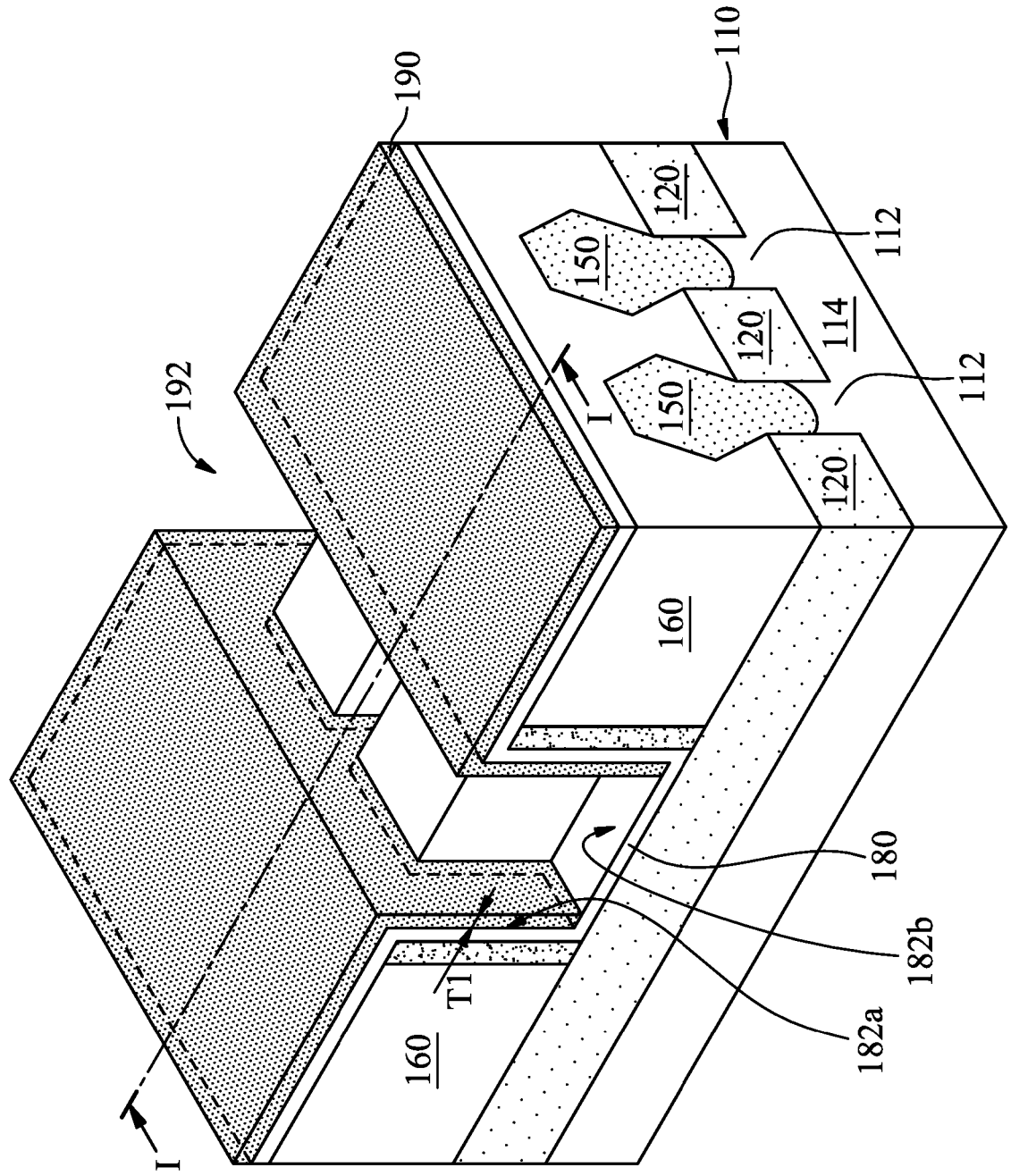
Figure 1I:
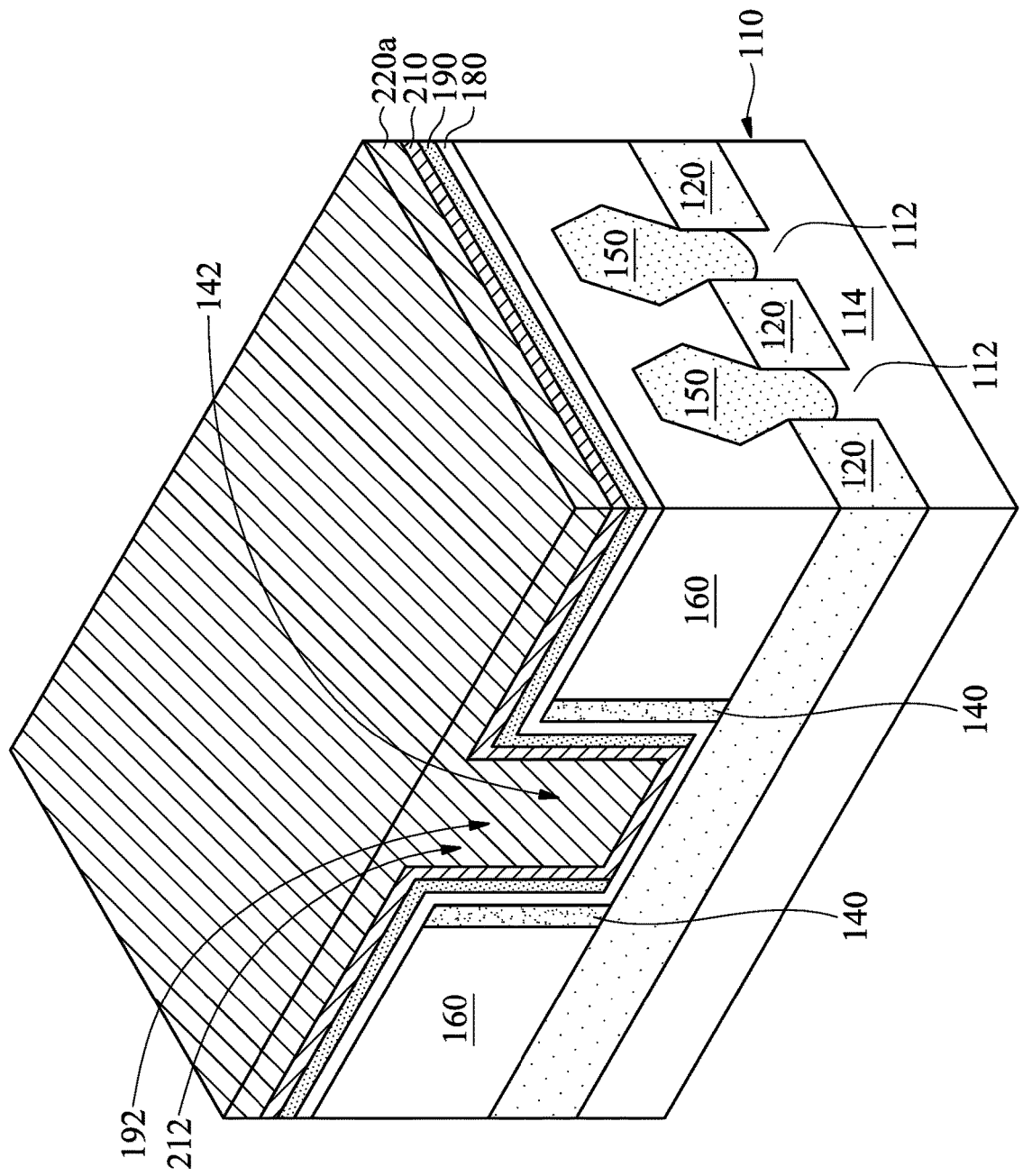
Figure 1J:
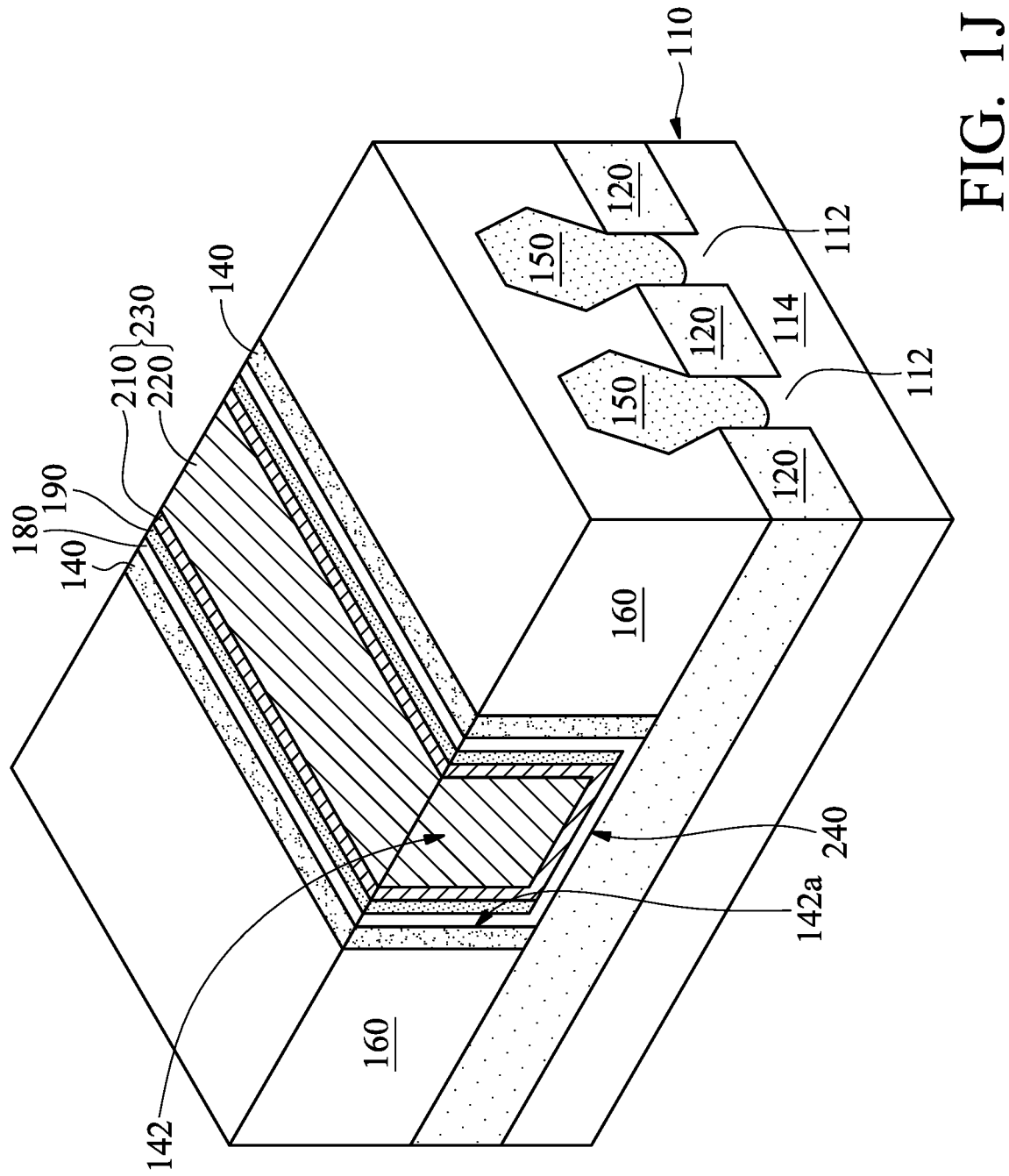
Figure 1K:
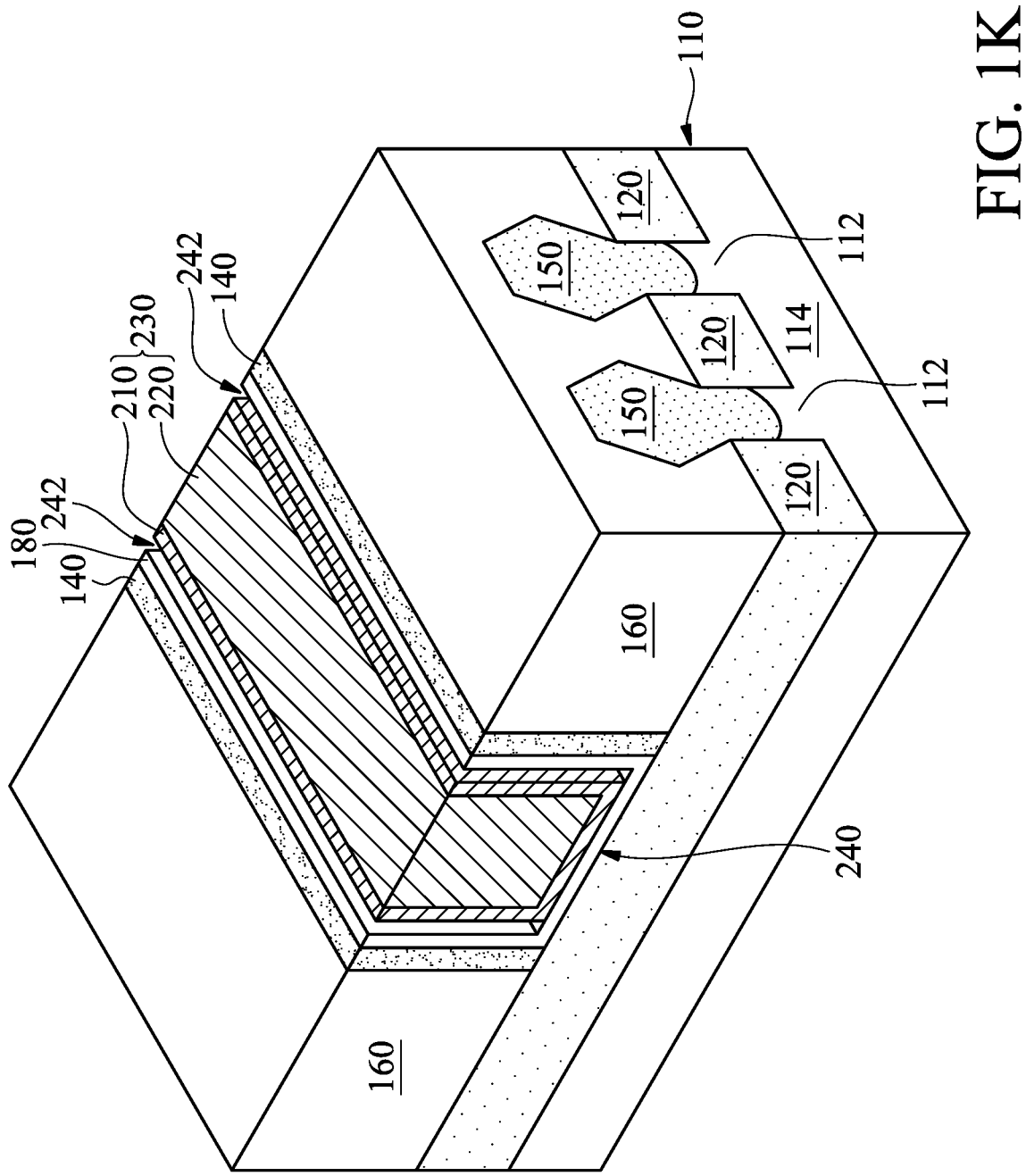
Figure 1L:
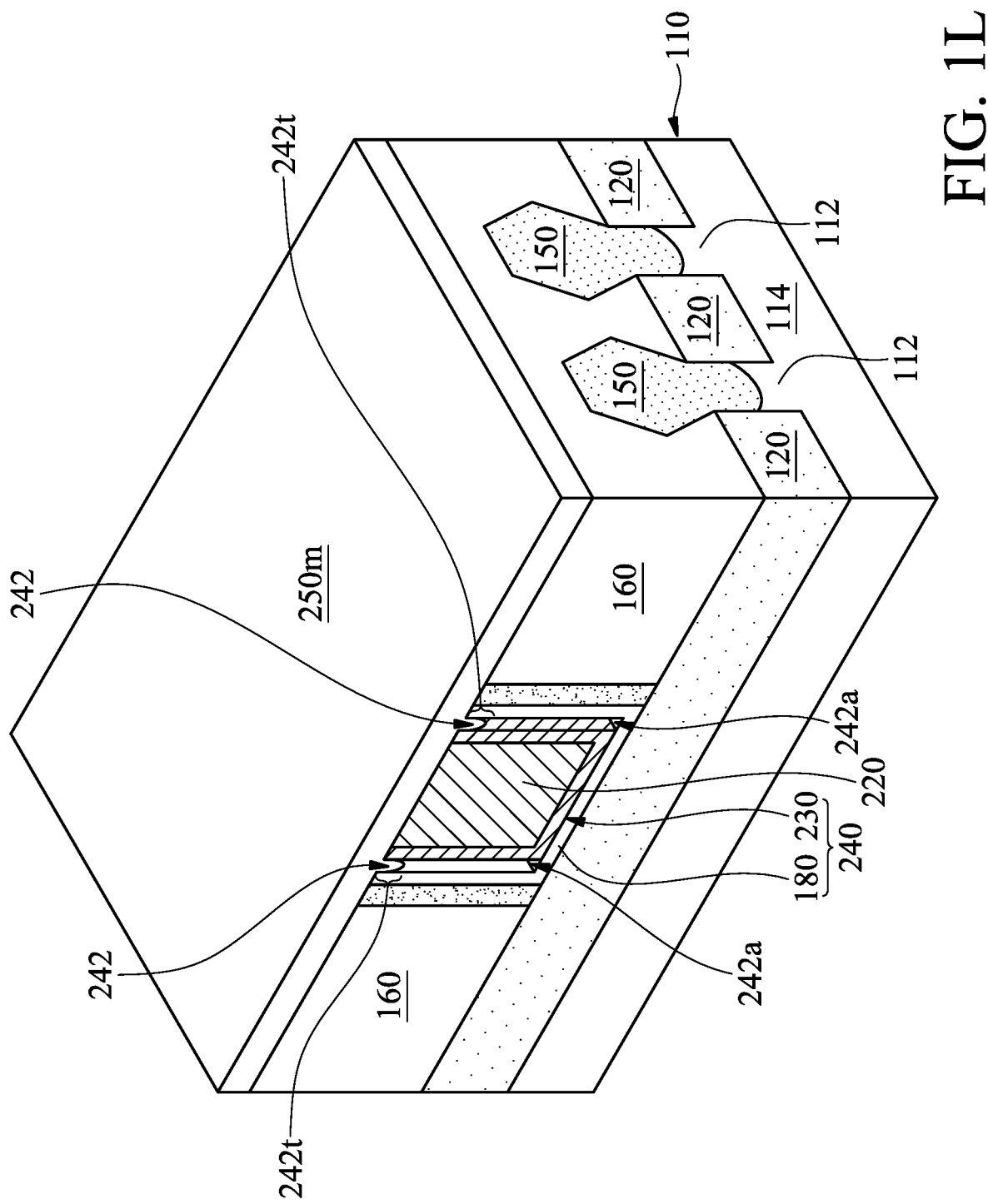
Figure 1M:
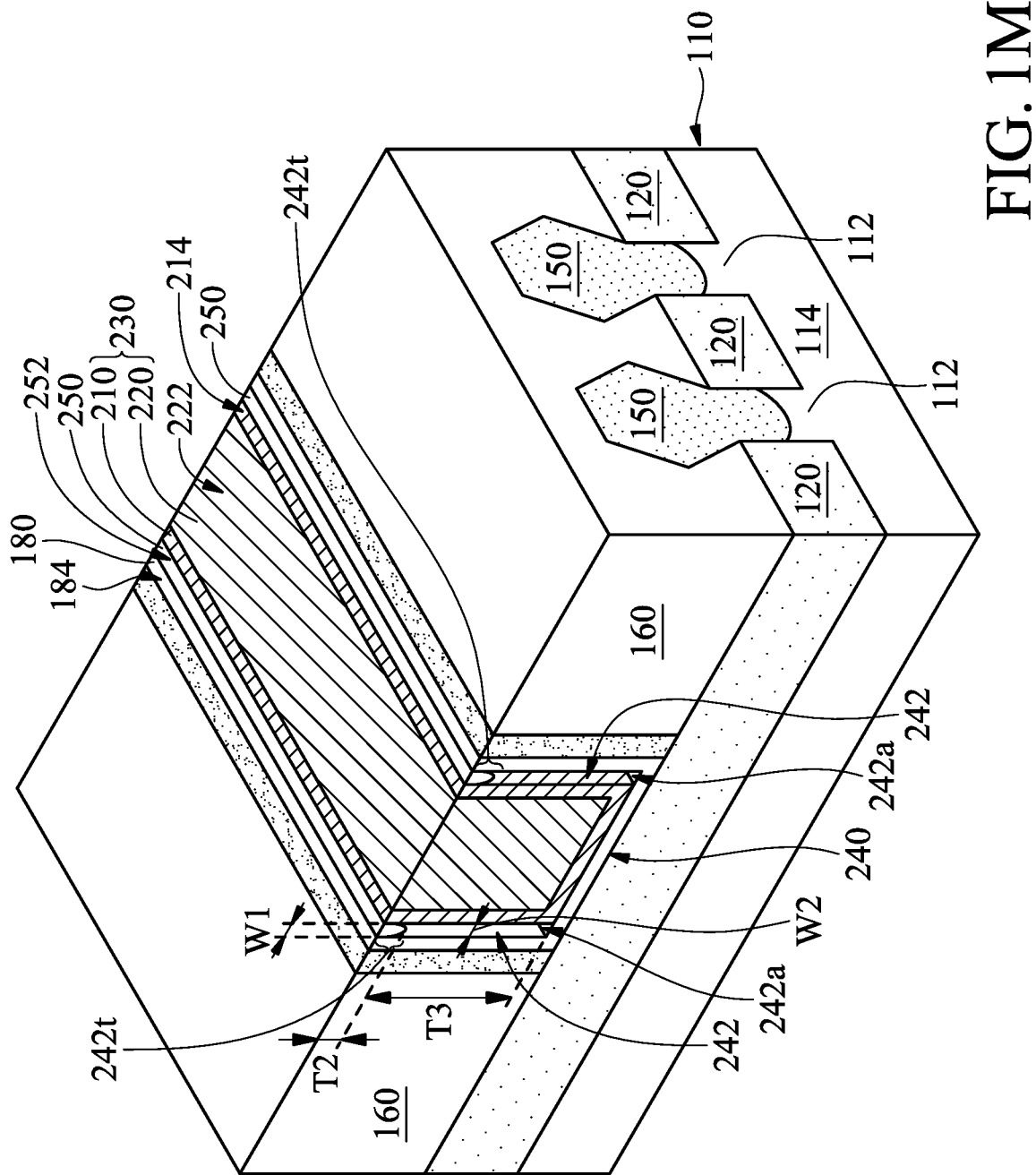
Figure 1N:
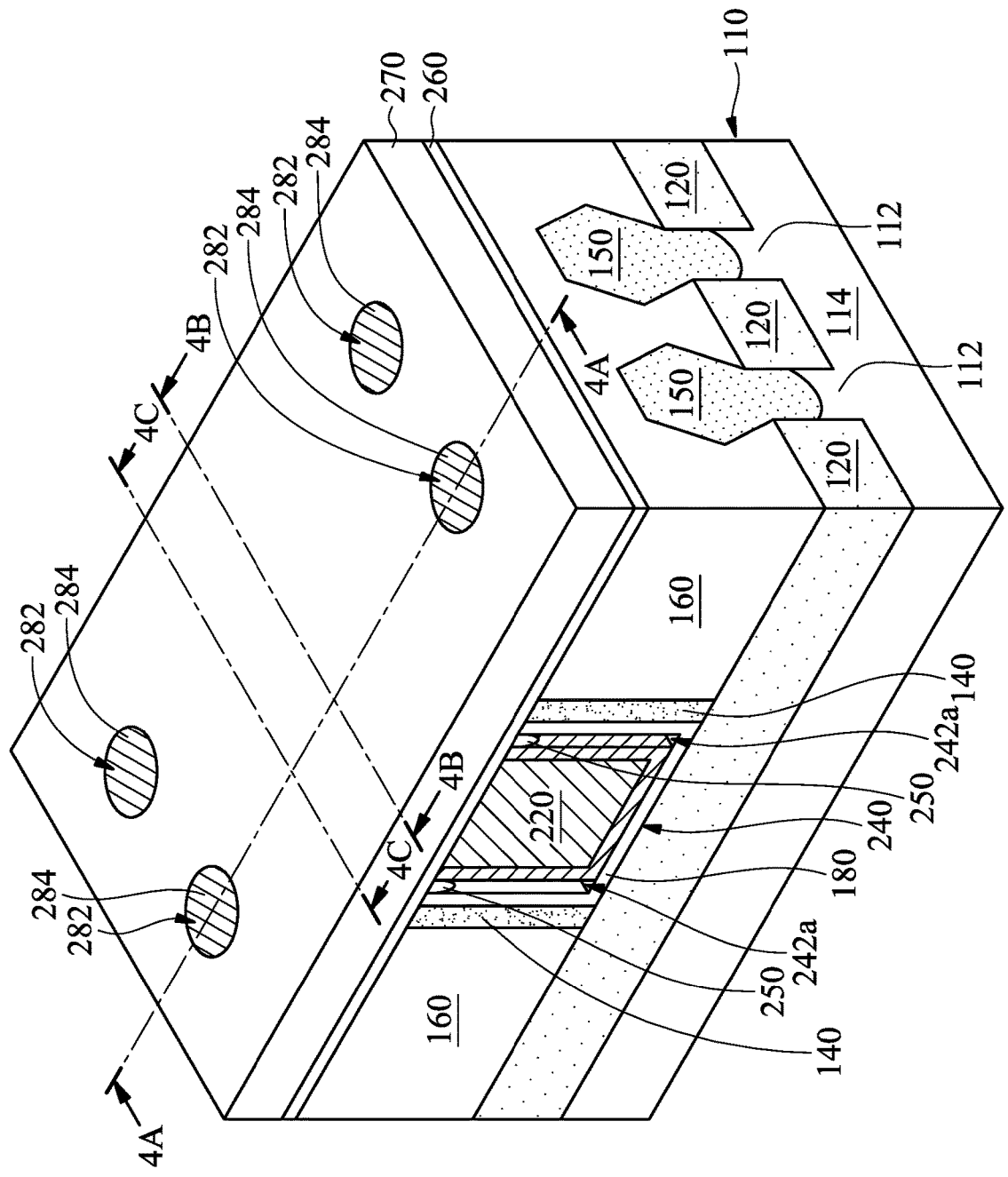

FIGS. 1A-1N are perspective views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, the substrate 110 has fin structures 112 and a base 114, in accordance with some embodiments. The fin structures 112 are over the base 114, in accordance with some embodiments. The fin structures 112 are spaced apart from each other, in accordance with some embodiments.

As shown in FIG. 1A, an isolation layer 120 is formed over the base 114, in accordance with some embodiments. Each fin structure 112 is partially in the isolation layer 120, in accordance with some embodiments. The isolation layer 120 surrounds lower portions of the fin structures 112, in accordance with some embodiments. The isolation layer 120 includes an oxide-containing material (such as silicon oxide), in accordance with some embodiments. The isolation layer 120 is formed by a chemical vapor deposition (CVD) process and an etching back process, in accordance with some embodiments.

As shown in FIG. 1B, a gate stack 130 is formed over the fin structures 112 and the isolation layer 120, in accordance with some embodiments. The gate stack 130 includes a gate dielectric layer 132 and a gate electrode 134, in accordance with some embodiments.

The gate dielectric layer 132 conformally covers the fin structures 112 and the isolation layer 120, in accordance with some embodiments. The gate dielectric layer 132 is in direct contact with the fin structures 112 and the isolation layer 120, in accordance with some embodiments. The gate dielectric layer 132 is made of an insulating material, such as an oxide-containing material (e.g. $SiO_2$), in accordance with some embodiments.

The gate electrode 134 is over the gate dielectric layer 132, in accordance with some embodiments. The gate electrode 134 is in direct contact with the gate dielectric layer 132, in accordance with some embodiments. The gate electrode 134 is made of a semiconductor material, such as polysilicon, in accordance with some embodiments.

As shown in FIG. 1B, spacers 140 are formed over sidewalls 136 of the gate stack 130, in accordance with some embodiments. The spacers 140 is positioned over the fin structures 112 and the isolation layer 120, in accordance with some embodiments. The spacers 140 are made of an insulating material, such as silicon oxide, silicon nitride, silicon oxynitride, or silicon carbide, in accordance with some embodiments. The formation of the spacers 140 includes a deposition process and an anisotropic etching process, in accordance with some embodiments.

As shown in FIG. 1C, the fin structures 112 are partially removed, in accordance with some embodiments. After the removal process, trenches 122 are formed in the isolation layer 120, in accordance with some embodiments. As shown in FIG. 1C, stressors 150 are formed in the trenches 122 and on the fin structures 112, in accordance with some embodiments.

The stressors 150 are in direct contact with the fin structures 112 thereunder, in accordance with some embodiments. The stressors 150 are positioned on two opposite sides of the gate stack 130, in accordance with some embodiments. The stressors 150 include source structures and drain structures, in accordance with some embodiments. The stressors 150 are also referred to as source/drain structures, in accordance with some embodiments.

The stressors 150 are made of a semiconductor material doped with N-type dopants, in accordance with some embodiments. The semiconductor material includes silicon or another suitable material, in accordance with some embodiments. The N-type dopants includes Group VA element, in accordance with some embodiments. The Group VA element includes phosphor (P), antimony (Sb), or another suitable Group VA material.

In some other embodiments, the stressors 150 are made of a semiconductor material doped with P-type dopants, in accordance with some embodiments. The semiconductor material includes silicon germanium (SiGe) or another suitable material, in accordance with some embodiments. The P-type dopants includes Group IIIA element, in accordance with some embodiments. The Group IIIA element includes boron or another suitable material. The stressors 150 are formed using an epitaxial process, in accordance with some embodiments.

As shown in FIG. 1D, a dielectric layer 160 is formed over the isolation layer 120 and the stressors 150, in accordance with some embodiments. The dielectric layer 160 includes an oxide-containing insulating material, such as silicon oxide, or a nitride-containing insulating material, such as silicon oxynitride, silicon oxycarbonitride, or silicon carbonitride, in accordance with some embodiments. The dielectric layer 160 is formed by a deposition process (e.g., a chemical vapor deposition process) and a planarization process (e.g., a chemical mechanical polishing process), in accordance with some embodiments.

As shown in FIG. 1E, the gate stack 130 is removed, in accordance with some embodiments. The removal process includes a wet etching process, in accordance with some embodiments. After the removal process, a trench 142 is formed between the spacers 140, in accordance with some embodiments. The trench 142 exposes the isolation layer 120 and upper portions 112a of the fin structures 112 between the stressors 150, in accordance with some embodiments.

As shown in FIG. 1E, an interfacial layer 170 is formed over the upper portions 112a of the fin structures 112, in accordance with some embodiments. The interfacial layer 170 is used to improve the adhesion between the fin structures 112 and a gate dielectric layer subsequently formed on the interfacial layer 170, in accordance with some embodiments. The interfacial layer 170 is made of an oxide-containing material, such as silicon oxide (e.g., $SiO_2$), in accordance with some embodiments. The interfacial layer 170 is formed using an oxidation process, in accordance with some embodiments.

As shown in FIGS. 1E and 1F, a gate dielectric layer 180 is deposited over the interfacial layer 170, the isolation layer 120, the spacers 140, and the dielectric layer 160, in accordance with some embodiments. The gate dielectric layer 180 conformally covers the interfacial layer 170, the isolation layer 120, the spacers 140, and the dielectric layer 160, in accordance with some embodiments.

The gate dielectric layer 180 conformally covers inner walls 142a and a bottom surface 142b of the trench 142, in accordance with some embodiments. Therefore, the gate dielectric layer 180 has a recess 182 in the trench 142, in accordance with some embodiments.

The gate dielectric layer 180 is made of a dielectric material, such as a high dielectric constant (high-k) material, in accordance with some embodiments. The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), aluminum oxide, hafnium dioxide-alumina ($HfO_2$—$Al_2O_3$) alloy, or combinations thereof, in accordance with some embodiments.

In some other embodiments, the high-k material is made of metal nitrides, metal silicates, transition metal-oxides, transition metal-nitrides, transition metal-silicates, oxynitrides of metals, other suitable materials, or combinations thereof. The gate dielectric layer 180 is deposited using a chemical vapor deposition (CVD) process, a thermal atomic layer deposition (ALD) process, a plasma enhanced atomic layer deposition (PEALD) process, or another suitable deposition process.

Figure 2:
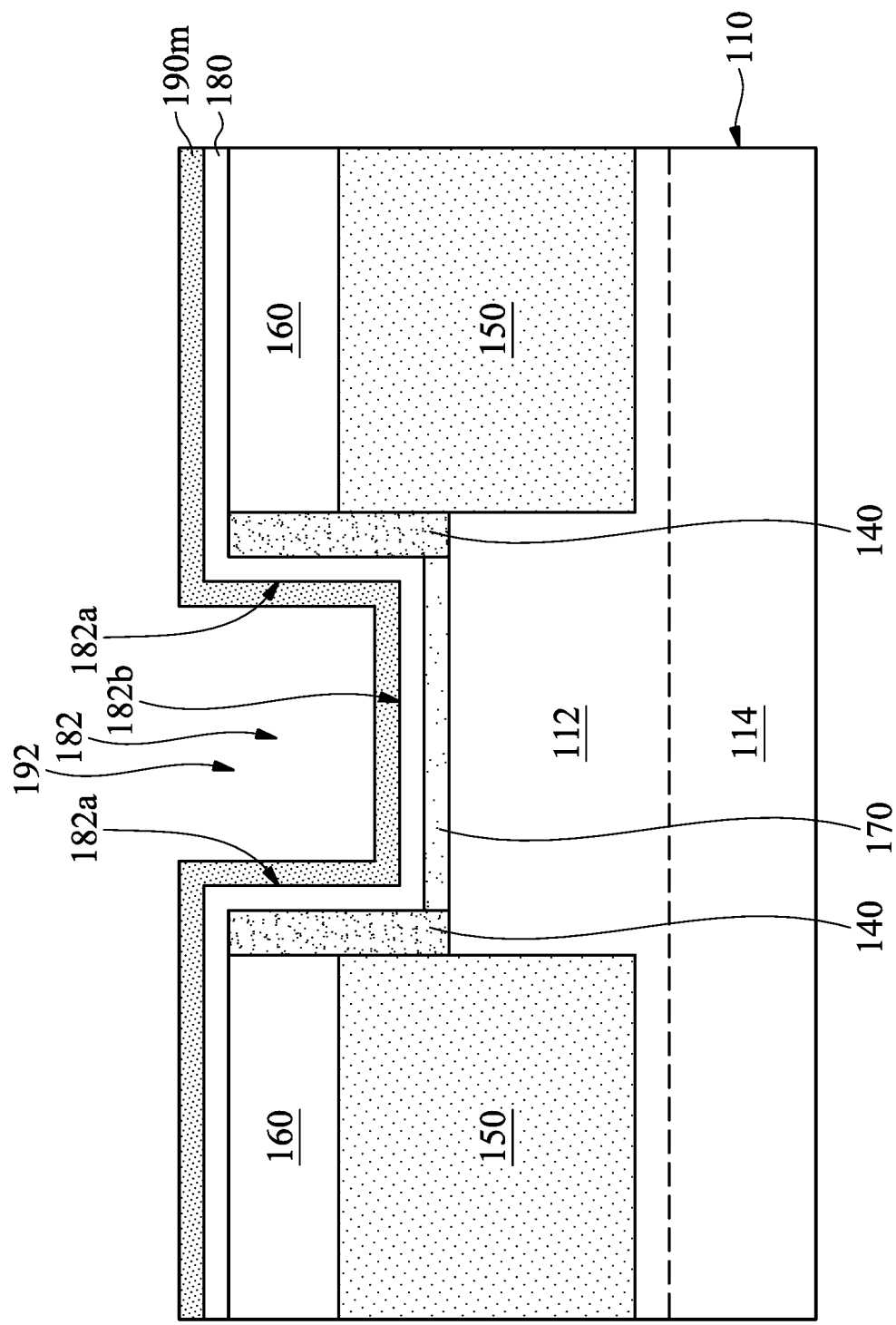
FIG. 2 is a cross-sectional view illustrating the semiconductor device structure along a sectional line I-I in FIG. 1G, in accordance with some embodiments.

FIG. 2 is a cross-sectional view illustrating the semiconductor device structure along a sectional line I-I in FIG. 1G, in accordance with some embodiments. As shown in FIGS. 1G and 2, a sacrificial material layer 190m is formed over the gate dielectric layer 180, in accordance with some embodiments. The sacrificial material layer 190m conformally covers inner walls 182a and a bottom surface 182b of the recess 182 of the gate dielectric layer 180, in accordance with some embodiments. The sacrificial material layer 190m has a recess 192 in the recess 182, in accordance with some embodiments.

The sacrificial material layer 190m is made of a material different from the materials of the gate dielectric layer 180, work function metal layer(s) and a gate electrode layer subsequently formed thereover, in accordance with some embodiments. Therefore, the sacrificial material layer 190m has etching selectivity with respect to the gate dielectric layer 180, the work function metal layer(s) and the gate electrode layer subsequently formed thereover, in accordance with some embodiments.

The material of the sacrificial material layer 190m includes a semiconductor material, such as silicon, in accordance with some embodiments. The sacrificial material layer 190m is formed using a deposition process, such as a chemical vapor deposition (CVD) process, an atomic layer deposition (ALD) process, or another suitable process, in accordance with some embodiments.

Figure 3:
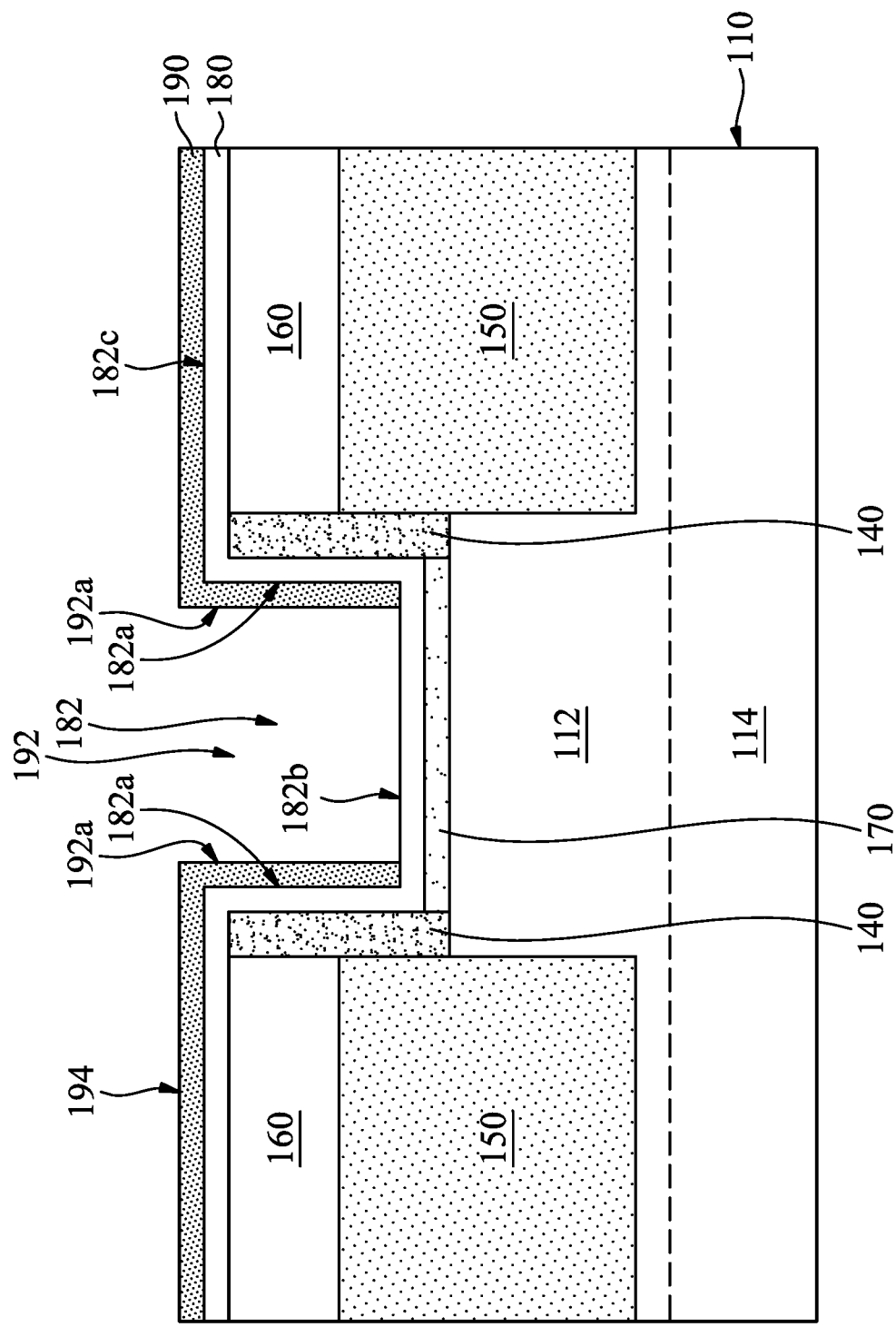
FIG. 3 is a cross-sectional view illustrating the semiconductor device structure along a sectional line I-I in FIG. 1H, in accordance with some embodiments.

FIG. 3 is a cross-sectional view illustrating the semiconductor device structure along a sectional line I-I in FIG. 1H, in accordance with some embodiments. As shown in FIGS. 1G, 1H and 3, the sacrificial material layer 190m over the bottom surface 182b of the recess 182 is removed, in accordance with some embodiments.

After the removal process, the recess 192 exposes the gate dielectric layer 180 thereunder, in accordance with some embodiments. The sacrificial material layer 190m remaining over the inner walls 182a of the recess 182 forms a sacrificial layer 190, in accordance with some embodiments. The sacrificial layer 190 has a thickness T1 ranging from about 0.5 nm to about 10 nm, in accordance with some embodiments.

The removal process includes a plasma process, in accordance with some embodiments. The plasma process includes deposition processes and etching processes, in accordance with some embodiments. The deposition processes and the etching processes are alternately performed, in accordance with some embodiments. In some other embodiments, the deposition processes and the etching processes are simultaneously performed. Each deposition process uses a polymer precursor gas as a process gas. Each etching process uses an etching gas as a process gas, in accordance with some embodiments.

During the deposition process, a polymer layer (not shown) is formed over inner walls 192a of the recess 192 and a top surface 194 of the sacrificial layer 190, in accordance with some embodiments. During the etching process, the polymer layer and the sacrificial material layer 190m over the bottom surface 182b (i.e., the sacrificial material layer 190m exposed by the polymer layer) are removed, in accordance with some embodiments.

As shown in FIG. 1I, a work function metal layer 210 is formed over the gate dielectric layer 180 and the sacrificial layer 190, in accordance with some embodiments. The work function metal layer 210 conformally covers the gate dielectric layer 180 and the sacrificial layer 190, in accordance with some embodiments. The work function metal layer 210 has a recess 212 in the recess 192, in accordance with some embodiments. The work function metal layer 210 provides a desired work function for transistors to enhance device performance including improved threshold voltage.

In the embodiments of forming an NMOS transistor, the work function metal layer 210 can be a material capable of providing a work function value suitable for the device, such as equal to or less than about 4.5 eV. The work function metal layer 210 may be made of metal, metal carbide, metal nitride, or a combination thereof. For example, the work function metal layer 210 is made of tantalum, tantalum nitride, or a combination thereof.

In the embodiments of forming a PMOS transistor, the work function metal layer 210 can be a material capable of providing a work function value suitable for the device, such as equal to or greater than about 4.8 eV. The work function metal layer 210 may be made of metal, metal carbide, metal nitride, other suitable materials, or a combination thereof.

For example, the work function metal layer 210 is made of titanium, titanium nitride, other suitable materials, or a combination thereof.

The work function metal layer 210 is formed using a deposition process, in accordance with some embodiments. The deposition process includes a physical vapor deposition (PVD) process, a chemical vapor deposition (CVD) process, an atomic layer deposition (ALD) process, another suitable method, or a combination thereof.

Afterwards, as shown in FIG. 1I, a gate electrode layer 220a (also called a metal gate electrode layer) is deposited over the work function metal layer 210 to fill the recess 212, in accordance with some embodiments. The gate electrode layer 220a are made of a suitable metal material, such as aluminum, tungsten, gold, platinum, cobalt, another suitable metal, an alloy thereof, or a combination thereof, in accordance with some embodiments.

The gate electrode layer 220a is formed using a deposition process, in accordance with some embodiments. The deposition process includes a physical vapor deposition (PVD) process, a chemical vapor deposition (CVD) process, an atomic layer deposition (ALD) process, another suitable method, or a combination thereof.

As shown in FIGS. 1I and 1J, the gate dielectric layer 180, the sacrificial layer 190, the work function metal layer 210, and the gate electrode layer 220a outside of the trench 142 are removed, in accordance with some embodiments. After the removal process, the gate electrode layer 220a remaining in the trench 142 forms a gate electrode 220, in accordance with some embodiments. After the removal process, the work function metal layer 210 and the gate electrode 220 together form a gate 230, in accordance with some embodiments.

The sacrificial layer 190 is between the gate 230 and the gate dielectric layer 180 over the inner wall 142a of the trench 142, in accordance with some embodiments. The gate 230 and the gate dielectric layer 180 together form a gate stack 240, in accordance with some embodiments.

As shown in FIG. 1K, the sacrificial layer 190 is removed to form trenches 242 between the gate 230 and the gate dielectric layer 180, in accordance with some embodiments. The removal process includes a dry etching process, such as a plasma etching process, in accordance with some embodiments. The plasma etching process uses an etching gas, which has a higher etching selectivity on the sacrificial layer 190 than on the gate 230 and the gate dielectric layer 180, in accordance with some embodiments.

As shown in FIG. 1L, a sealing material layer 250m is deposited over the dielectric layer 160, the gate dielectric layer 180, and the gate 230, in accordance with some embodiments. The sealing material layer 250m extends into upper portions 242t of the trenches 242, and lower portions of the trenches 242 form gaps 242a, in accordance with some embodiments. Each gap 242a is surrounded by the sealing material layer 250m, the gate 230, and the gate dielectric layer 180, in accordance with some embodiments. The gaps 242a are vacuum gaps or air gaps, in accordance with some embodiments. If the gaps 242a are air gaps, the gas in the gaps 242a includes nitrogen ($N_2$), inert gases (e.g., He, Ne, Ar, Kr, Xe, or Rn) or another suitable gas.

The sealing material layer 250m is made of an insulating material, such as a nitride material (e.g., silicon nitride), in accordance with some embodiments. The sealing material layer 250m and the gate dielectric layer 180 are made of different materials, in accordance with some embodiments.

The dielectric constant of the sealing material layer 250m is lower than that of the gate dielectric layer 180, in accordance with some embodiments.

The sealing material layer 250m is formed using a deposition process, in accordance with some embodiments. The deposition process includes a physical vapor deposition (PVD) process, a chemical vapor deposition (CVD) process, an atomic layer deposition (ALD) process, another suitable method, or a combination thereof.

As shown in FIGS. 1L and 1M, the sealing material layer 250m outside of the trenches 242 is removed, in accordance with some embodiments. The sealing material layer 250m remaining in the trenches 242 forms a sealing layer 250, in accordance with some embodiments. The sealing layer 250 is in the upper portions 242t of the trenches 242, in accordance with some embodiments.

The upper portions 242t of the trenches 242 are sealed with the sealing layer 250, in accordance with some embodiments. The sealing layer 250 is between the gate dielectric layer 180 and the gate 230, in accordance with some embodiments. The sealing layer 250 is in direct contact with the gate dielectric layer 180 and the work function metal layer 210, in accordance with some embodiments.

The sealing layer 250 is over the gaps 242a, in accordance with some embodiments. The sealing layer 250 is thinner than the gap 242a, in accordance with some embodiments. That is, the thickness T2 of the sealing layer 250 is less than the thickness T3 of the gap 242a, in accordance with some embodiments.

In some embodiments, a width W1 of the sealing layer 250 is substantially equal to a width W2 of the gap 242a thereunder, in accordance with some embodiments. The term "substantially equal to" in the application means "within 10%", in accordance with some embodiments. For example, the term "substantially equal to" means the difference between the widths W1 and W2 is within 10% of the average width between the sealing layer 250 and the gap 242a, in accordance with some embodiments. The difference may be due to manufacturing processes. The width W1 or W2 ranges from about 0.5 nm to about 10 nm, in accordance with some embodiments.

The removal process includes a planarization process, such as a chemical mechanical polishing process, in accordance with some embodiments. Therefore, top surfaces 252, 184, 214, and 222 of the sealing layer 250, the gate dielectric layer 180, the work function metal layer 210, and the gate electrode 220 are substantially coplanar with each other, in accordance with some embodiments. The term "substantially coplanar" in the application may include small deviations from coplanar geometries. The deviations may be due to manufacturing processes.

Figure 4A:
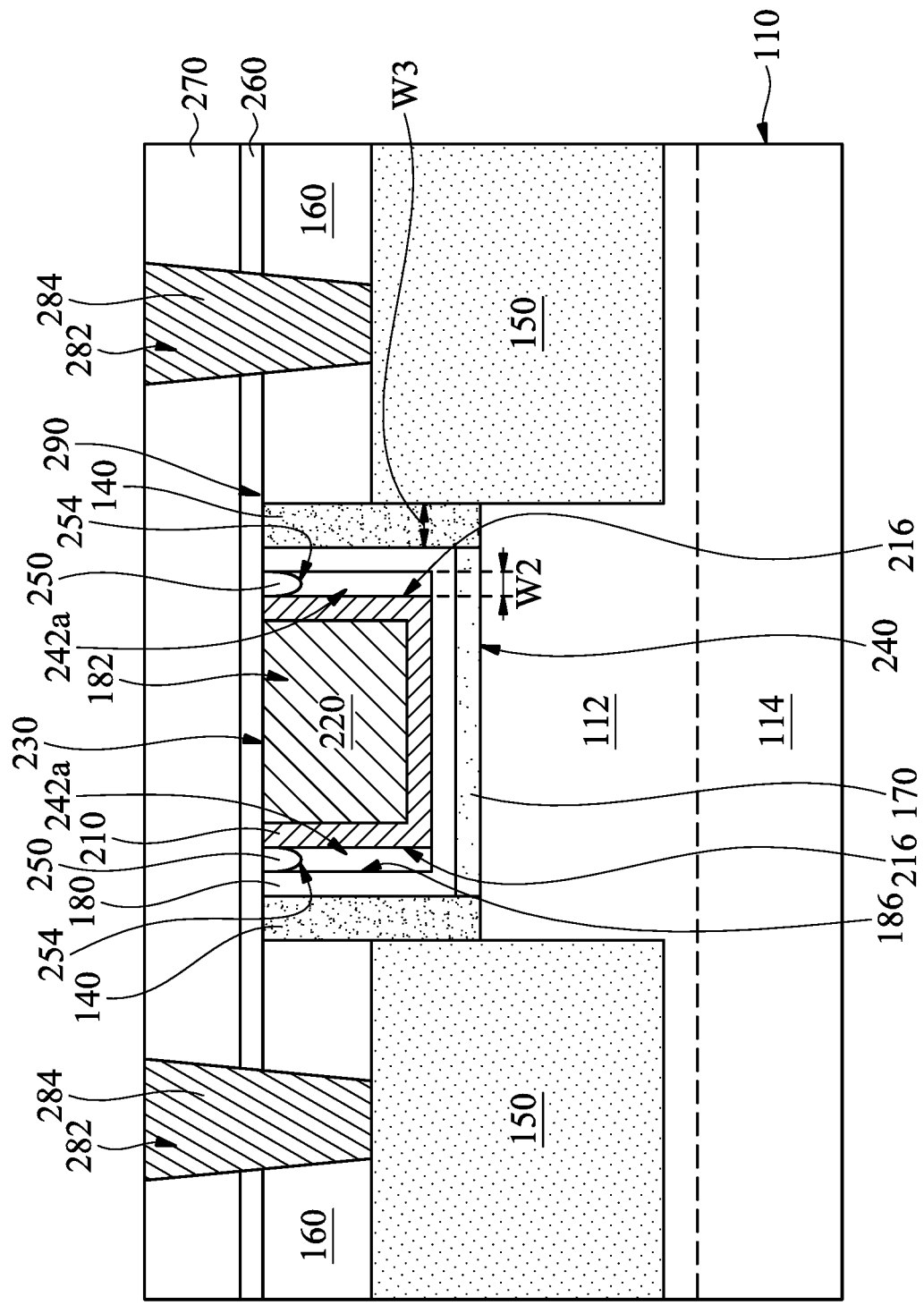
FIG. 4A is a cross-sectional view illustrating the semiconductor device structure along a sectional line 4A-4A in FIG. 1N, in accordance with some embodiments.
Figure 4B:
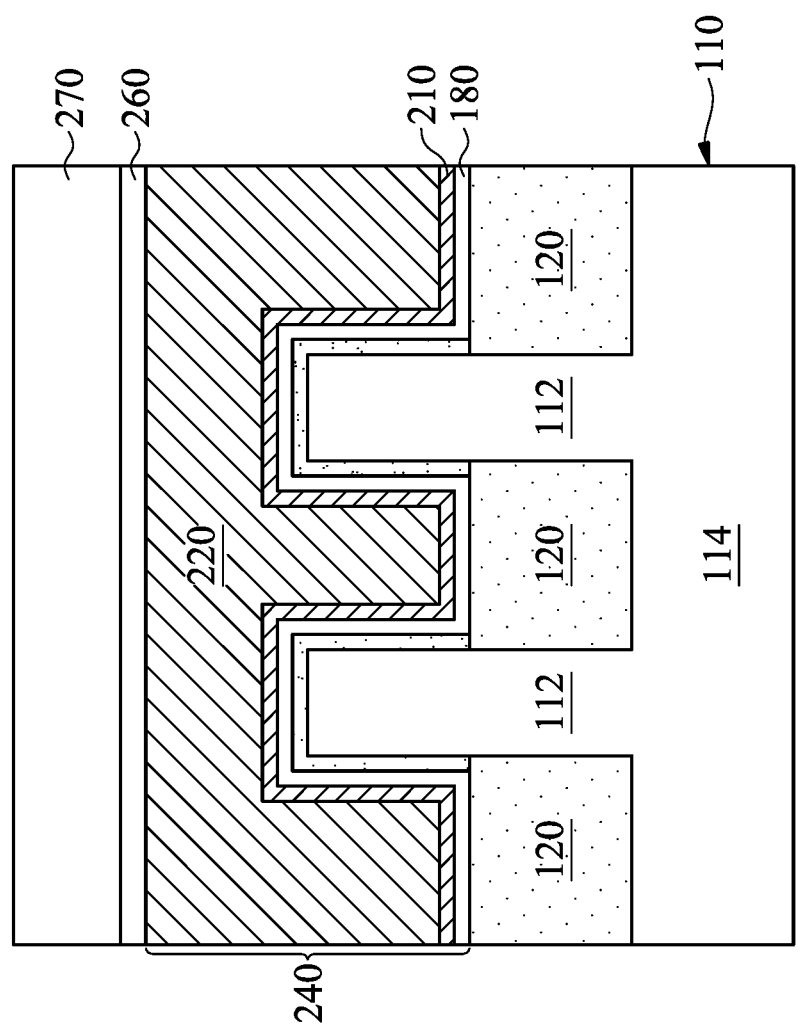
FIG. 4B is a cross-sectional view illustrating the semiconductor device structure along a sectional line 4B-4B in FIG. 1N, in accordance with some embodiments.
Figure 4C:
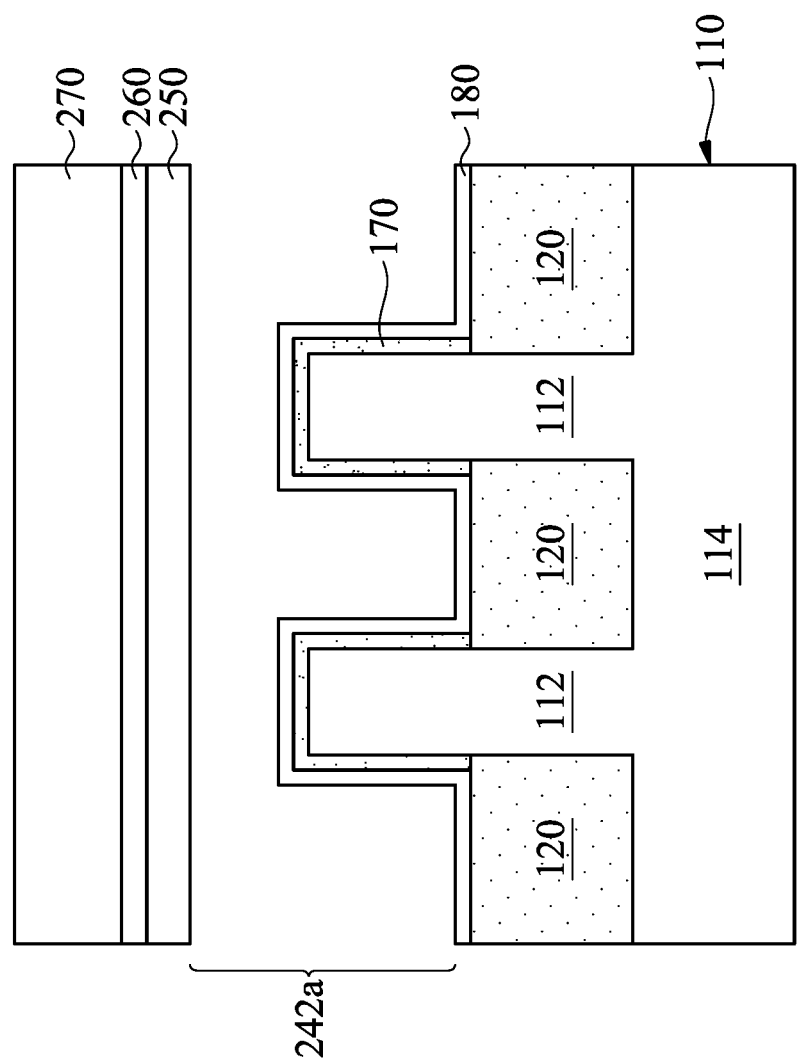
FIG. 4C is a cross-sectional view illustrating the semiconductor device structure along a sectional line 4C-4C in FIG. 1N, in accordance with some embodiments.

FIG. 4A is a cross-sectional view illustrating the semiconductor device structure along a sectional line 4A-4A in FIG. 1N, in accordance with some embodiments. FIG. 4B is a cross-sectional view illustrating the semiconductor device structure along a sectional line 4B-4B in FIG. 1N, in accordance with some embodiments. FIG. 4C is a cross-sectional view illustrating the semiconductor device structure along a sectional line 4C-4C in FIG. 1N, in accordance with some embodiments.

As shown in FIGS. 1N and 4A-4B, an etch stop layer 260 is formed over the dielectric layer 160, the gate stack 240, the sealing layer 250, and the spacers 140, in accordance with some embodiments. The etch stop layer 260 is made of is a dielectric material which is different from the materials of the dielectric layer 160 and a dielectric layer subsequently formed thereover, in accordance with some embodiments.

The etch stop layer 260 includes a nitride material, such as silicon nitride, in accordance with some embodiments. However, in some other embodiments, the etch stop layer 260 is not formed.

As shown in FIGS. 1N and 4A-4B, a dielectric layer 270 is formed over the etch stop layer 260, in accordance with some embodiments. The dielectric layer 270 includes an oxide-containing insulating material, such as silicon oxide, or a nitride-containing insulating material, such as silicon oxynitride, silicon oxycarbonitride, or silicon carbonitride, in accordance with some embodiments. The dielectric layer 270 and the etch stop layer 260 are made of different materials, in accordance with some embodiments. The dielectric layer 270 is formed by a deposition process, such as a chemical vapor deposition process, in accordance with some embodiments.

As shown in FIGS. 1N and 4A, portions of the dielectric layer 270, the etch stop layer 260, and the dielectric layer 160 are removed, in accordance with some embodiments. The removal process forms through holes 282 pass through the dielectric layer 270, the etch stop layer 260, and the dielectric layer 160 and expose the stressors 150 thereunder, in accordance with some embodiments. The removal process includes a photolithography process and an etching process (e.g., a dry etching process), in accordance with some embodiments.

As shown in FIGS. 1N and 4A, contact structures 284 are respectively formed in the through holes 282, in accordance with some embodiments. The contact structures 284 pass through the dielectric layer 270, the etch stop layer 260, and the dielectric layer 160 to be connected to the stressors 150 thereunder, in accordance with some embodiments.

The contact structures 284 are made of a conductive material, such as tungsten or aluminum, in accordance with some embodiments. The formation of the contact structures 284 includes depositing a conductive layer (not shown) over the dielectric layer 270 and in the through holes 282; and removing the conductive layer outside of the through holes 282, in accordance with some embodiments.

As shown in FIG. 4A, a bottom surface 254 of the sealing layer 250 is exposed to the gaps 242a. The bottom surface 254 is a curved surface, in accordance with some embodiments. In some embodiments, sidewalls 216 of the work function layer 210 are exposed to the gaps 242a. The gate dielectric layer 180 has inner walls 186 facing the gate 230, in accordance with some embodiments. The inner walls 186 are exposed to the gaps 242a, in accordance with some embodiments. In some embodiments, a lower portion of the gap 242a and the gate dielectric layer 180 adjacent to the lower portion of the gap 242a are between the gate 230 and the stressor 150.

The gate stack 240 and the stressors 150 together form a transistor 290, in accordance with some embodiments. As shown in FIGS. 1N and 4A-4B, the gate stack 240 wraps around the fin structures 112 between the stressors 150, in accordance with some embodiments. As shown in FIGS. 1N and 4A-4C, the gaps 242a wrap around the fin structures 112 between the gate 230 and the stressors 150, in accordance with some embodiments.

Since the gate dielectric layer 180 has a high dielectric constant (or a high-K value, which is, for example, about 25), the parasitic capacitance between the gate 230 and the stressors 150 is negatively related to the distance between the gate 230 and the gate dielectric layer 180 (which is between the gate 230 and the stressors 150). Since the gaps 242a increase the distance between the gate 230 and the gate dielectric layer 180 and the dielectric constant of the gaps 242a is low (about 1), the gaps 242a reduce the parasitic capacitance between the gate 230 and the stressors 150. The parasitic capacitance of the transistor 290 with the gaps 242a is reduced by about 5% to about 15% relative to transistors without gaps, in accordance with some embodiments. Therefore, the performance of the transistor 290 with the gaps 242a is improved, in accordance with some embodiments.

Since the overlap region between a gate and stressors of a fin-type field effect transistor (FinFET) is greater than the overlap region between a gate and stressors of a planar-type field effect transistor, the parasitic capacitance of the fin-type field effect transistor may be greater than that of the planar-type field effect transistor. Since the gaps 242a wraps around the fin structures 112 between the gate 230 and the stressors 150 to increase the distance between the gate 230 and the gate dielectric layer 180, the parasitic capacitance of the fin-type field effect transistor (e.g., the transistor 290) may be significantly reduced.

In the process for forming a transistor without gaps, a dummy gate stack (i.e., a dummy poly gate stack) is formed to reserve a space for accommodating a metal gate stack, which is formed in a subsequent gate replacement process and includes a gate dielectric layer and a gate, in accordance with some embodiments.

In comparison with the dummy gate stack used to form the transistor without gaps, the (dummy) gate stack 130 (as shown in FIG. 1D) is wider to reserve a wider space for accommodating a wider metal gate stack (i.e., the gate stack 240 of FIG. 1N), which further has the gaps 242a, in accordance with some embodiments. Therefore, the (dummy) gate stack 130 (as shown in FIG. 1D) is wider, which facilitates the dummy gate stack removal process and the subsequent gate dielectric layer deposition process (as shown in FIG. 1F), in accordance with some embodiments.

The width W2 of the gap 242a is less than a width W3 of the spacer 140, in accordance with some embodiments. In some embodiments, a ratio (W2/W3) of the width W2 to the width W3 ranges from about 0.2 to about 0.6. If the ratio (W2/W3) is less than 0.2, the reduction of the parasitic capacitance may be not sufficient.

If the ratio (W2/W3) is greater than 0.6, the gaps 242a may occupy too much space in the recess 182 of the gate dielectric layer 180 and therefore the width of the gate 230 may be decreased, which may affect the performance of the transistor 290. If the width of the gate 230 is maintained constant and the ratio (W2/W3) is greater than 0.6, the gaps 242a may occupy too much space between the gate 230 and the stressors 150 and therefore the width W3 of the spacer 140 may be decreased, which may result in that the etching process for forming the (contact) through holes 282 may etch through the spacers 140.

Figure 5A:
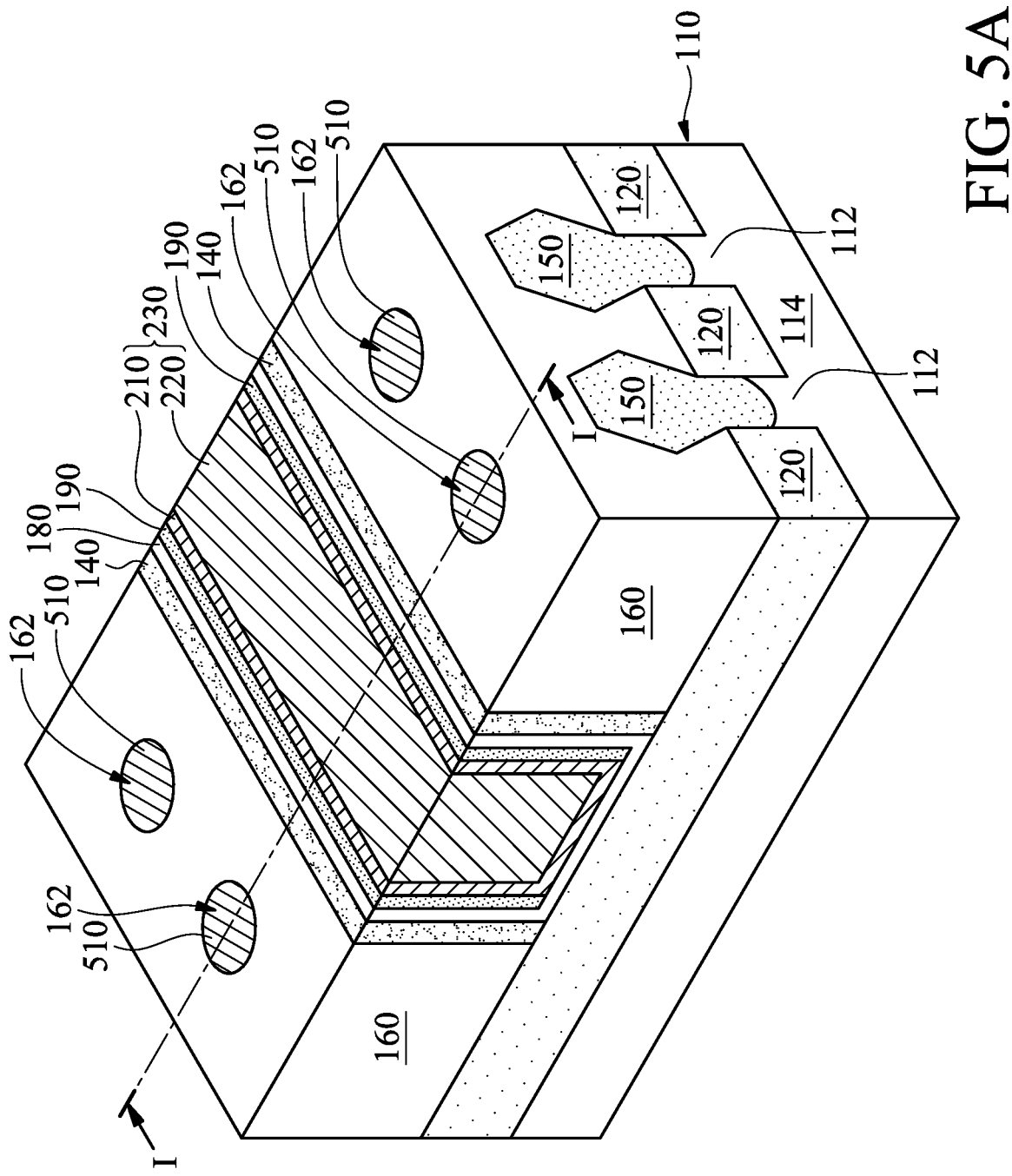
FIGS. 5A-5C are perspective views of various stages of a process for forming a semiconductor device structure, in accordance with some embodiments.
Figure 5B:
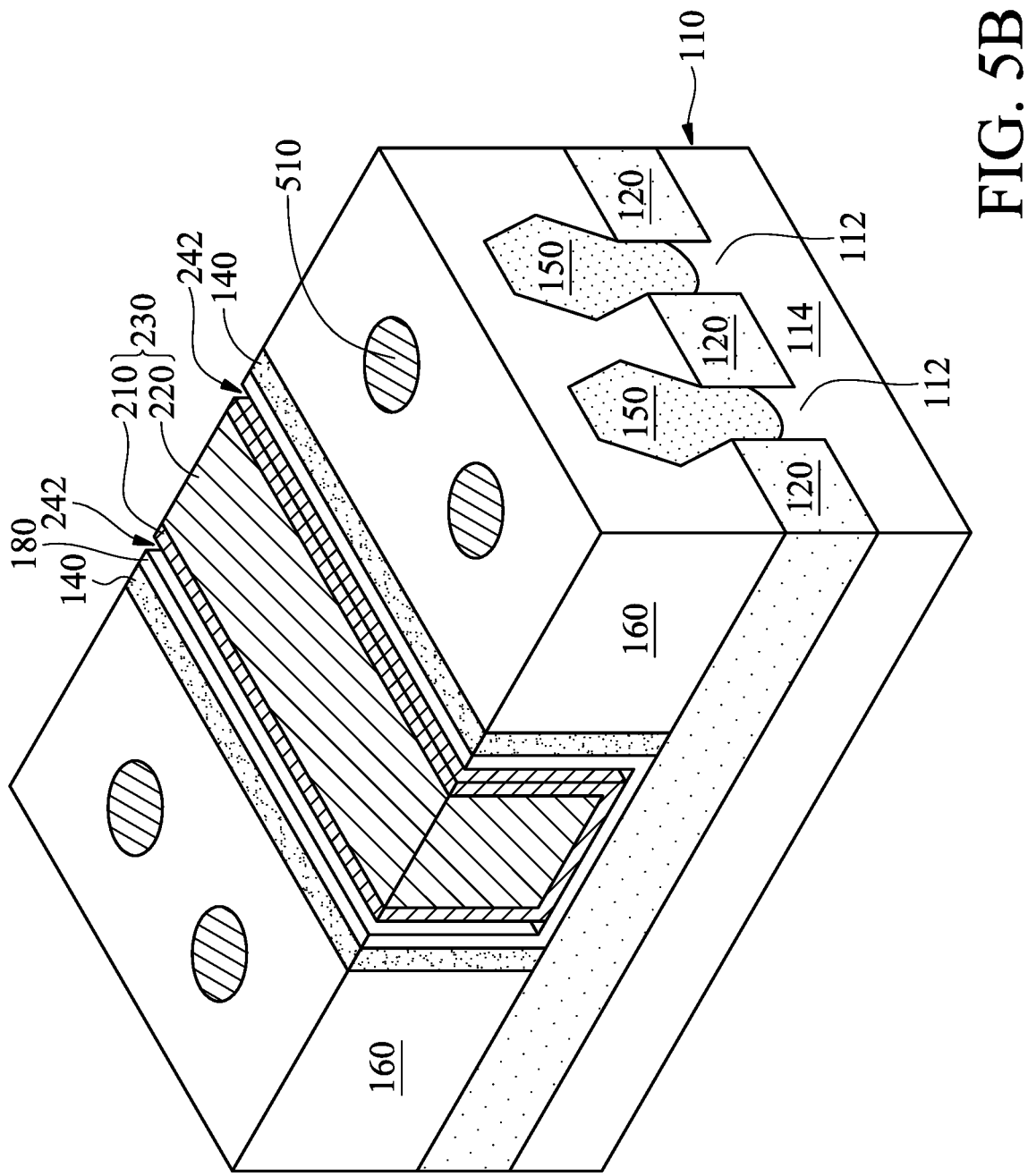
Figure 5C:
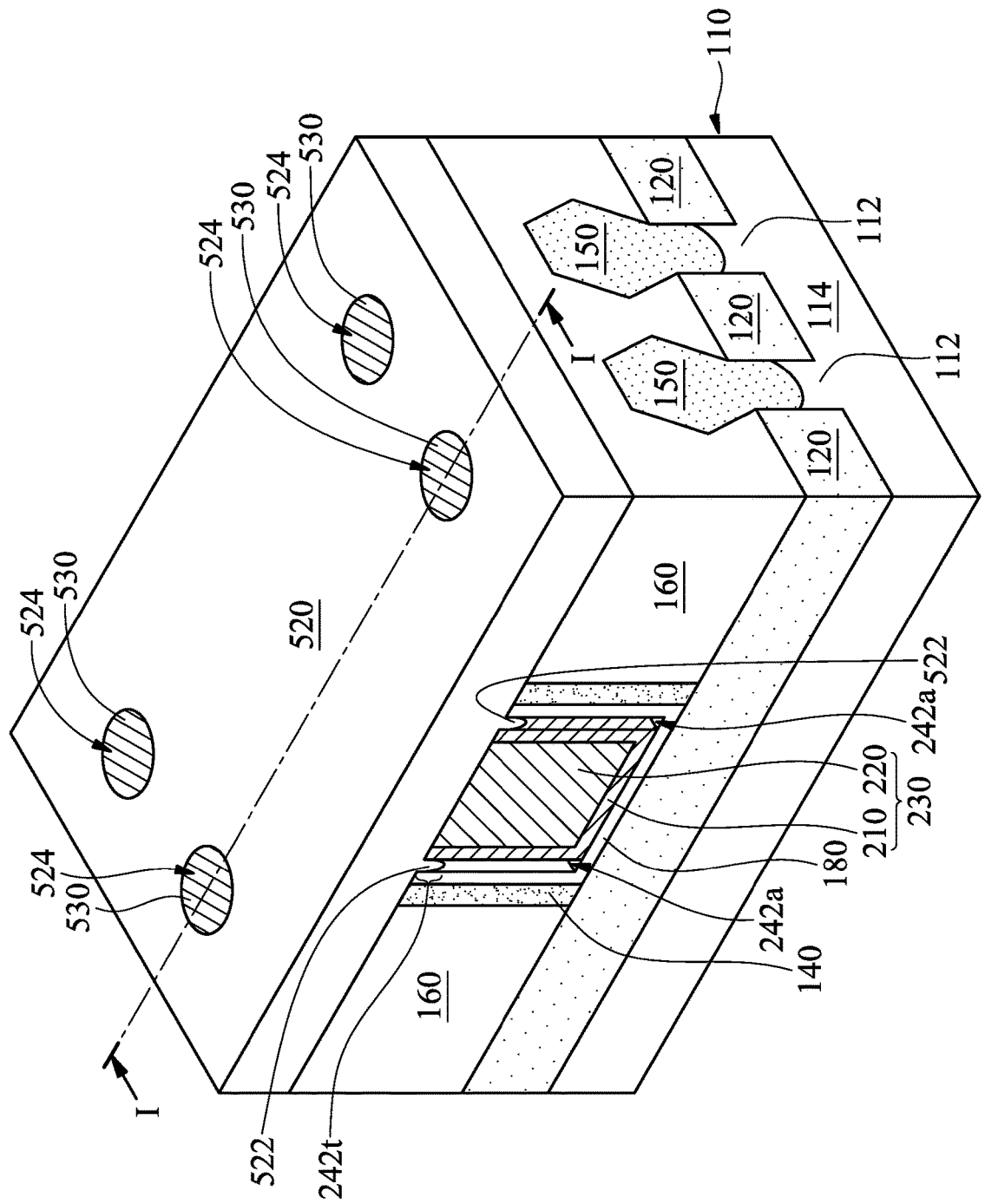
Figure 6:
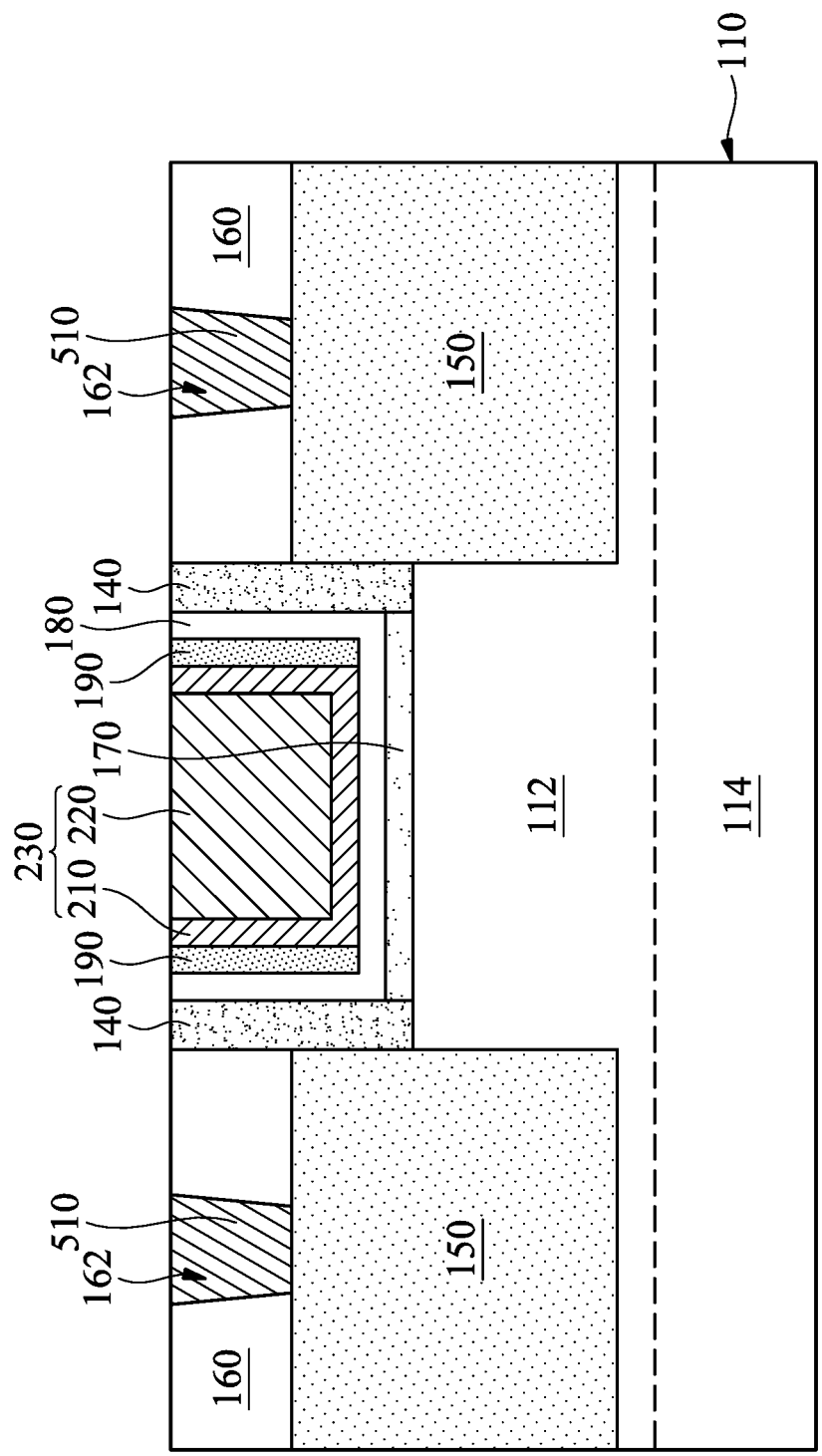
FIG. 6 is a cross-sectional view illustrating the semiconductor device structure along a sectional line I-I in FIG. 5A, in accordance with some embodiments.

FIGS. 5A-5C are perspective views of various stages of a process for forming a semiconductor device structure, in accordance with some embodiments. FIG. 6 is a cross-sectional view illustrating the semiconductor device structure along a sectional line I-I in FIG. 5A, in accordance with some embodiments.

After the step of FIG. 1J, as shown in FIGS. 5A and 6, portions of the dielectric layer 160 are removed to form through holes 162 in the dielectric layer 160, in accordance with some embodiments. The through holes 162 expose portions of the stressors 150, in accordance with some embodiments. Thereafter, as shown in FIGS. 5A and 6, contact structures 510 are respectively formed in the through holes 162, in accordance with some embodiments.

The contact structures 510 pass through the dielectric layer 160 to be connected to the stressors 150 thereunder, in accordance with some embodiments. The contact structures 510 are made of a conductive material, such as tungsten or aluminum, in accordance with some embodiments. The formation of the contact structures 510 includes depositing a conductive layer (not shown) over the dielectric layer 160 and in the through holes 162; and removing the conductive layer outside of the through holes 162, in accordance with some embodiments.

Afterwards, as shown in FIGS. 5A and 5B, the sacrificial layer 190 is removed to form trenches 242 between the gate 230 and the gate dielectric layer 180, in accordance with some embodiments. The removal process includes a dry etching process, such as a plasma etching process, in accordance with some embodiments.

Figure 7:
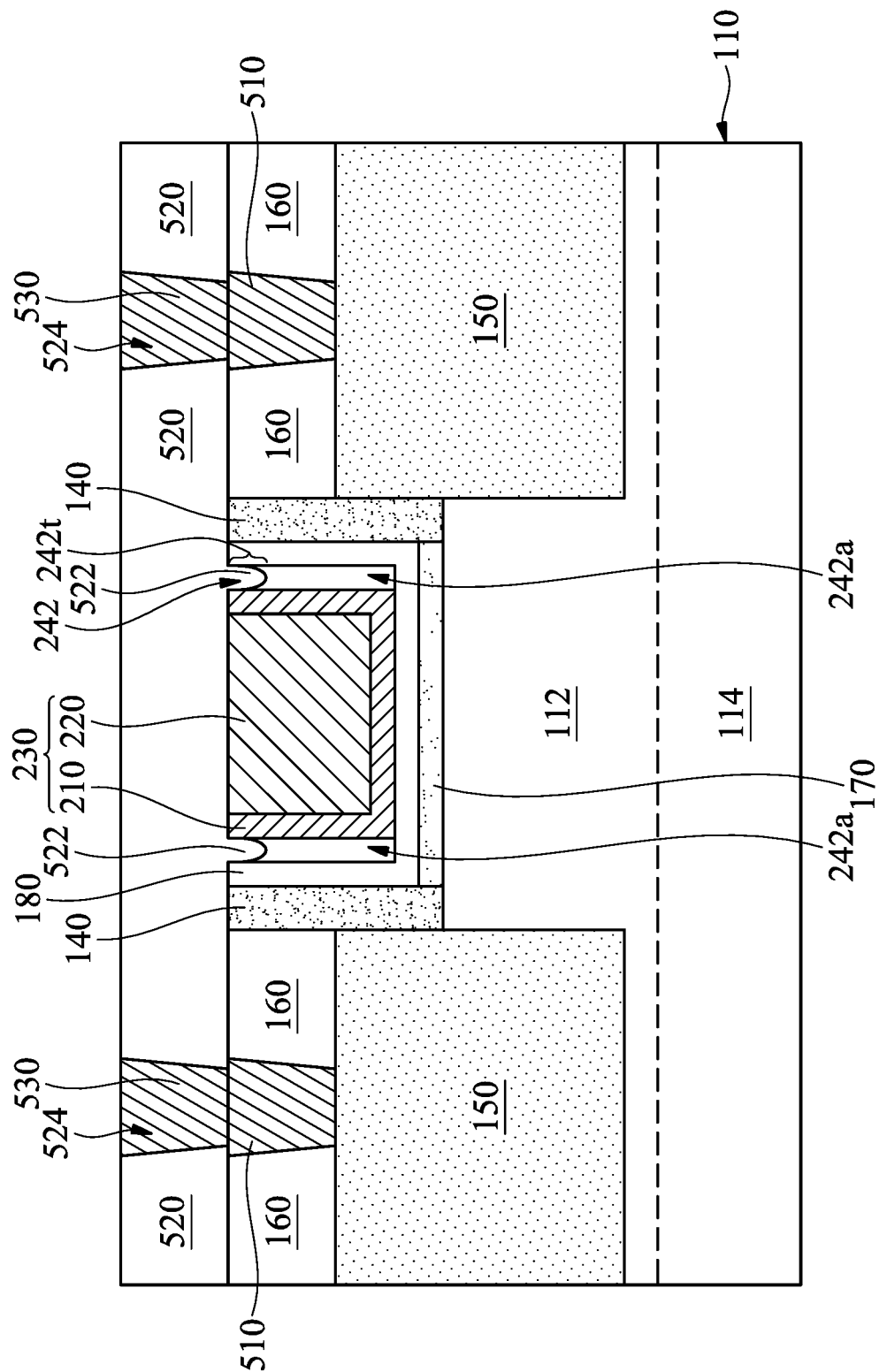
FIG. 7 is a cross-sectional view illustrating the semiconductor device structure along a sectional line I-I in FIG. 5C, in accordance with some embodiments.

FIG. 7 is a cross-sectional view illustrating the semiconductor device structure along a sectional line I-I in FIG. 5C, in accordance with some embodiments. As shown in FIGS. 5C and 7, a dielectric layer 520 is formed over the dielectric layer 160, the spacers 140, the gate dielectric layer 180, and the gate 230, in accordance with some embodiments. In some embodiments, protruding portions 522 of the dielectric layer 520 extend into the upper portions 242t of the trenches 242, and the lower portions of the trenches 242 form gaps 242a. Each gap 242a is surrounded by the protruding portion 522 thereover, the gate 230, and the gate dielectric layer 180, in accordance with some embodiments. The protruding portion 522 seals the gap 242a thereunder, in accordance with some embodiments.

The dielectric layer 520 includes an oxide-containing insulating material, such as silicon oxide, or a nitride-containing insulating material, such as silicon nitride, silicon oxynitride, silicon oxycarbonitride, or silicon carbonitride, in accordance with some embodiments. The dielectric layer 520 is formed by a deposition process, such as a chemical vapor deposition process, in accordance with some embodiments.

As shown in FIGS. 5C and 7, portions of the dielectric layer 520 are removed to form through holes 524 in the dielectric layer 520, in accordance with some embodiments. The through holes 524 pass through the dielectric layer 520 and expose the contact structures 510 thereunder, in accordance with some embodiments.

As shown in FIGS. 5C and 7, contact structures 530 are respectively formed in the through holes 524, in accordance with some embodiments. The contact structures 530 pass through the dielectric layer 520 to be connected to the contact structures 510 thereunder, in accordance with some embodiments. The contact structures 530 are made of a conductive material, such as tungsten or aluminum, in accordance with some embodiments. The formation of the contact structures 530 includes depositing a conductive layer (not shown) over the dielectric layer 520 and in the through holes 524; and removing the conductive layer outside of the through holes 524, in accordance with some embodiments.

Figure 8A:
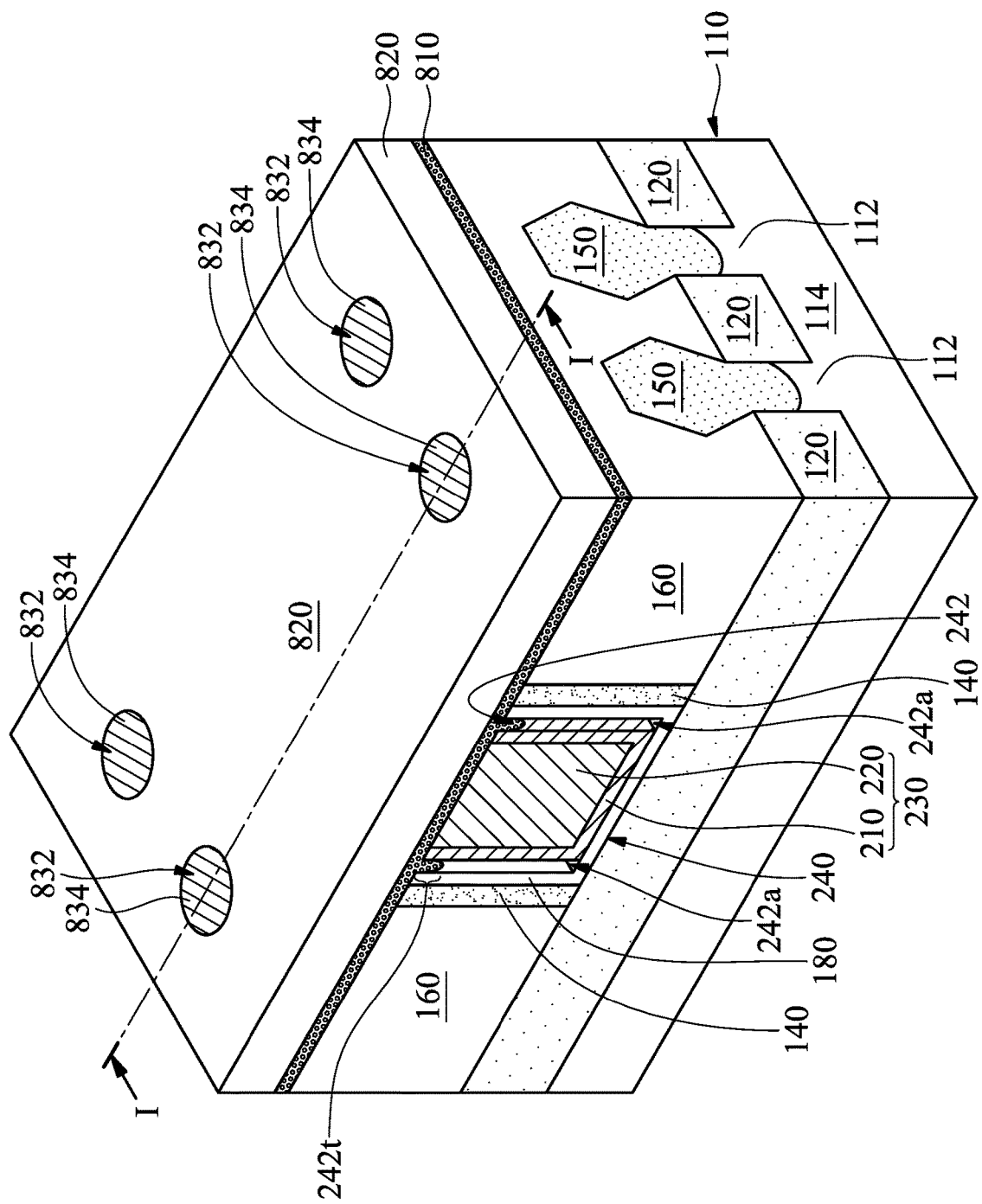
FIG. 8A is a perspective view of a semiconductor device structure, in accordance with some embodiments.
Figure 8B:
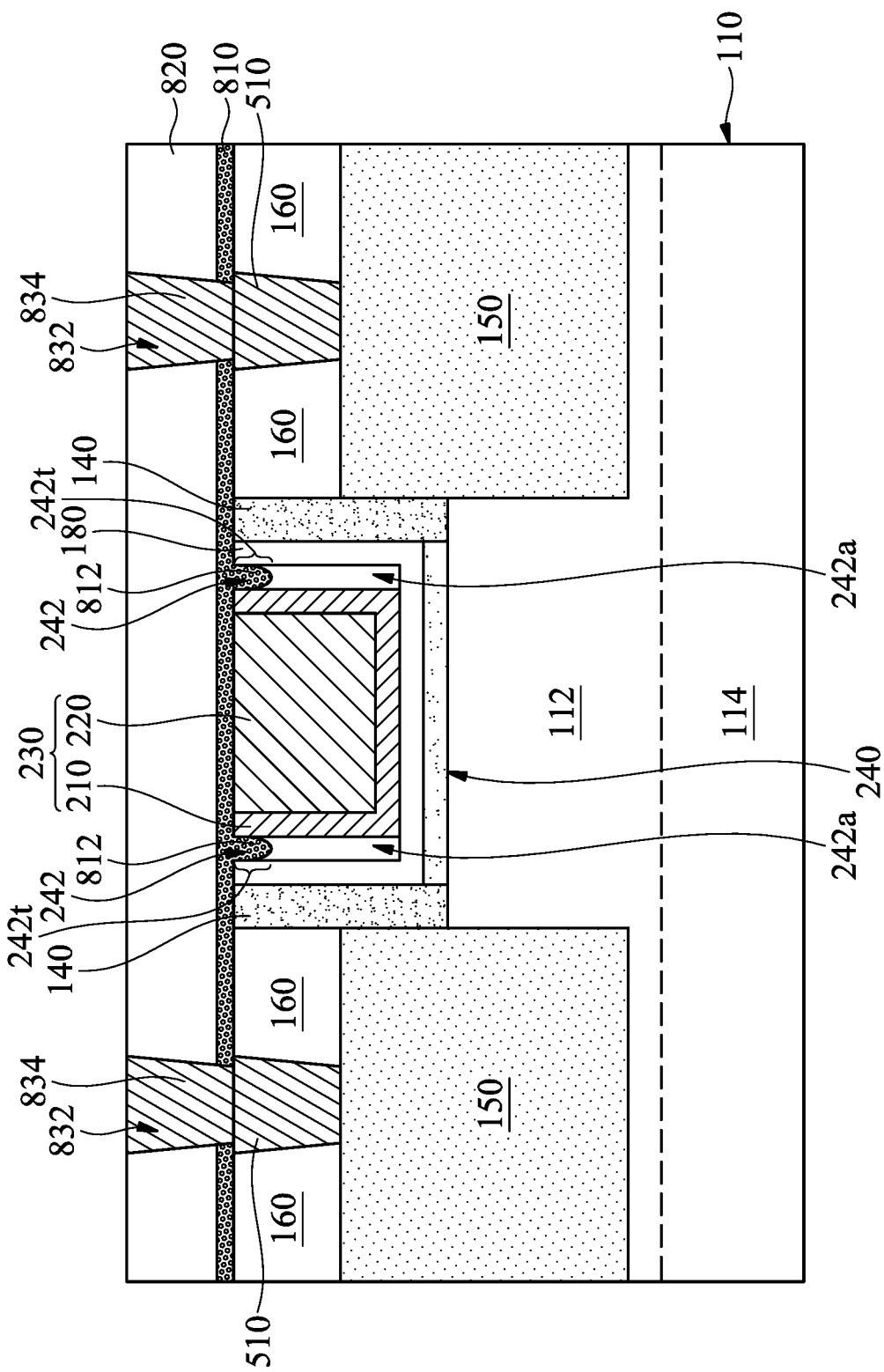
FIG. 8B is a cross-sectional view illustrating the semiconductor device structure along a sectional line I-I in FIG. 8A, in accordance with some embodiments.

FIG. 8A is a perspective view of a semiconductor device structure, in accordance with some embodiments. FIG. 8B is a cross-sectional view illustrating the semiconductor device structure along a sectional line I-I in FIG. 8A, in accordance with some embodiments.

After the step of FIG. 5B, as shown in FIGS. 8A and 8B, an etch stop layer 810 is formed over the dielectric layer 160, the gate stack 240, and the spacers 140, in accordance with some embodiments. In some embodiments, protruding portions 812 of the etch stop layer 810 extend into the upper portions 242t of the trenches 242, and the lower portions of the trenches 242 form gaps 242a. Each gap 242a is surrounded by the protruding portion 812 thereover, the gate 230, and the gate dielectric layer 180, in accordance with some embodiments. The protruding portion 812 seals the gap 242a thereunder, in accordance with some embodiments.

The etch stop layer 810 is made of is a dielectric material which is different from the materials of the dielectric layer 160 and a dielectric layer subsequently formed thereover, in accordance with some embodiments. The etch stop layer 810 includes a nitride material, such as silicon nitride, in accordance with some embodiments.

As shown in FIGS. 8A and 8B, a dielectric layer 820 is formed over the etch stop layer 810, in accordance with some embodiments. The dielectric layer 820 includes an oxide-containing insulating material, such as silicon oxide, or a nitride-containing insulating material, such as silicon oxynitride, silicon oxycarbonitride, or silicon carbonitride, in accordance with some embodiments. The dielectric layer 820 and the etch stop layer 810 are made of different materials, in accordance with some embodiments. The dielectric layer 820 is formed by a deposition process, such as a chemical vapor deposition process, in accordance with some embodiments.

As shown in FIGS. 8A and 8B, portions of the dielectric layer 820 and the etch stop layer 810 are removed to form through holes 832, in accordance with some embodiments. The through holes 832 pass through the dielectric layer 820 and the etch stop layer 810 and expose the contact structures 510 thereunder, in accordance with some embodiments.

As shown in FIGS. 8A and 8B, contact structures 834 are respectively formed in the through holes 832, in accordance with some embodiments. The contact structures 834 pass through the dielectric layer 820 and the etch stop layer 810 to be connected to the contact structures 510 thereunder, in accordance with some embodiments.

The contact structures 834 are made of a conductive material, such as tungsten or aluminum, in accordance with some embodiments. The formation of the contact structures 834 includes depositing a conductive layer (not shown) over the dielectric layer 820 and in the through holes 832; and removing the conductive layer outside of the through holes 832, in accordance with some embodiments.

FIGS. 1A-1N, 5C and 8A are perspective views of a portion of a semiconductor device structure. For the sake of clarity, FIGS. 1L-1N, 5C and 8A omit the gate dielectric layer 180 sealing the end portions of the gaps 242a, and therefore FIGS. 1L-1N, 5C and 8A show the end portions of the gaps 242a. In the semiconductor device structure, the gaps 242a are embedded in the gate stack 240 and are sealed gaps (or close gaps) sealed by the gate 230, the gate dielectric layer 180, and a sealing structure (e.g., the sealing layer 250 or the protruding portions 522 or 812) over the gaps 242a, in accordance with some embodiments.

In accordance with some embodiments, semiconductor device structures and methods for forming the same are provided. The methods (for forming the semiconductor device structures) form gaps between a gate and a gate dielectric layer to reduce the parasitic capacitance between the gate and stressors. Therefore, the performance of a transistor with the gaps is improved.

In accordance with some embodiments, a semiconductor device structure is provided. The semiconductor device structure includes a substrate. The semiconductor device structure includes a first source/drain structure and a second source/drain structure in the substrate. The semiconductor device structure includes a gate stack over the substrate and between the first source/drain structure and the second source/drain structure. The gate stack includes a gate dielectric layer and a gate over the gate dielectric layer, a portion of the gate dielectric layer is adjacent to a first sidewall of the gate, and the gate stack has a gap between the first sidewall and the portion of the gate dielectric layer.

In accordance with some embodiments, a semiconductor device structure is provided. The semiconductor device structure includes a substrate comprising a base and a fin structure over the base. The semiconductor device structure includes a first source/drain structure and a second source/drain structure in the fin structure. The semiconductor device structure includes a gate stack wrapping around the fin structure between the first source/drain structure and the second source/drain structure. The gate stack includes a gate dielectric layer and a gate over the gate dielectric layer, the gate stack has a first gap between the gate and a first portion of the gate dielectric layer, and the first portion of the gate dielectric layer is between the first gap and the first source/drain structure.

In accordance with some embodiments, a method for forming a semiconductor device structure is provided. The method includes forming a first source/drain structure and a second source/drain structure in a substrate. The method includes forming a first dielectric layer over the first source/drain structure, the second source/drain structure, and the substrate. The first dielectric layer has a first trench exposing a portion of the substrate between the first source/drain structure and the second source/drain structure. The method includes forming a gate dielectric layer over a first inner wall and a first bottom surface of the first trench. The gate dielectric layer has a recess in the first trench. The method includes forming a sacrificial layer over a second inner wall of the recess. The method includes forming a gate in the recess. The sacrificial layer is between the gate and the gate dielectric layer over the first inner wall. The method includes removing the sacrificial layer to form a second trench between the gate and the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a first source/drain structure and a second source/drain structure in the substrate;
   a gate stack over the substrate and between the first source/drain structure and the second source/drain structure, wherein the gate stack comprises a gate dielectric layer and a gate over the gate dielectric layer, a portion of the gate dielectric layer is adjacent to a first sidewall of the gate, the portion has an inner wall facing the first sidewall, the gate stack has a gap between the first sidewall and the portion of the gate dielectric layer, and the gap is a vacuum gap or an air gap; and
   a sealing layer between and in direct contact with the inner wall of the portion of the gate dielectric layer and the first sidewall of the gate, wherein the sealing layer is over the gap, and a first top surface of the sealing layer is level with a second top surface of the gate and a third top surface of the gate dielectric layer.

2. The semiconductor device structure as claimed in claim 1, wherein the gate comprises a work function layer and a gate electrode, the work function layer wraps around a bottom surface and a second sidewall of the gate electrode, and a third sidewall of the work function layer over the second sidewall is exposed to the gap.

3. The semiconductor device structure as claimed in claim 1, wherein the sealing layer and the gate dielectric layer are made of different materials.

4. The semiconductor device structure as claimed in claim 1, wherein the sealing layer is thinner than the gap.

5. The semiconductor device structure as claimed in claim 1, wherein a bottom surface of the sealing layer is exposed to the gap.

6. The semiconductor device structure as claimed in claim 1, wherein the inner wall of the portion of the gate dielectric layer is exposed to the gap.

7. The semiconductor device structure as claimed in claim 1, further comprising:
   a spacer over a second sidewall of the gate dielectric layer, wherein a first width of the gap is less than a second width of the spacer.

8. A semiconductor device structure, comprising:
   a substrate comprising a base and a fin structure over the base;
   a first source/drain structure and a second source/drain structure in the fin structure;
   a gate stack wrapping around the fin structure between the first source/drain structure and the second source/drain structure, wherein the gate stack comprises a gate dielectric layer and a gate over the gate dielectric layer, the gate stack has a first gap between the gate and a first portion of the gate dielectric layer, the first gap is a first vacuum gap or a first air gap, and the first portion of the gate dielectric layer is between the first gap and the first source/drain structure; and
   a first contact structure over and connected to the first source/drain structure, wherein the first portion of the gate dielectric layer is between the first gap and the first contact structure.

9. The semiconductor device structure as claimed in claim 8, wherein the gate stack further has a second gap between the gate and a second portion of the gate dielectric layer, the second gap is a second vacuum gap or a second air gap, the second portion is between the second gap and the second source/drain structure, and the gate is between the first gap and the second gap.

10. The semiconductor device structure as claimed in claim 8, wherein a sidewall of the gate and an inner wall of the gate dielectric layer are exposed to the first gap.

11. The semiconductor device structure as claimed in claim 8, further comprising:
    a first dielectric layer over the first source/drain structure, the second source/drain structure, and the base; and
    a second dielectric layer over the first dielectric layer and the gate stack, wherein the second dielectric layer has a protruding portion between the gate and the gate dielectric layer and over the first gap, and the protruding portion seals the first gap.

12. The semiconductor device structure as claimed in claim 8, further comprising:
    a first dielectric layer over the first source/drain structure and the second source/drain structure;
    an etch stop layer over the first dielectric layer and the gate stack, wherein the etch stop layer has a protruding portion between the gate and the gate dielectric layer and over the first gap, and the protruding portion seals the first gap; and a second dielectric layer over the etch stop layer, wherein the second dielectric layer and the etch stop layer are made of different materials, and the first contact structure passes through the second dielectric layer, the etch stop layer, and the first dielectric layer to be connected to the first source/drain structure.

13. A semiconductor device structure, comprising:

a substrate comprising a base and a fin structure over the base;

a first source/drain structure and a second source/drain structure in the fin structure; and a gate stack over the fin structure between the first source/drain structure and the second source/drain structure, wherein the gate stack comprises a gate dielectric layer and a gate over the gate dielectric layer, a first bottom portion of the gate is in direct contact with a second bottom portion of the gate dielectric layer, the gate stack has a gap between the gate and the gate dielectric layer, the fin structure extends into the gap, and a top surface of the fin structure is higher than a third bottom portion of the gap.

14. The semiconductor device structure as claimed in claim 13, wherein a portion of the gate dielectric layer is between the gap and the fin structure.

15. The semiconductor device structure as claimed in claim 13, wherein the gate stack further comprises a sealing layer, the sealing layer is between the gate and the gate dielectric layer and over the gap to seal the gap, the fin structure has a first sidewall and a second sidewall opposite to the first sidewall, and the sealing layer continuously extends across the first sidewall and the second sidewall of the fin structure.

16. The semiconductor device structure as claimed in claim 15, wherein the sealing layer has a curved bottom surface.

17. The semiconductor device structure as claimed in claim 1, wherein a gas in the air gap comprises nitrogen or an inert gas.

18. The semiconductor device structure as claimed in claim 9, wherein the first gap is between the second gap and the first contact structure.

19. The semiconductor device structure as claimed in claim 18, further comprising:

a second contact structure over and connected to the second source/drain structure, wherein the second portion of the gate dielectric layer is between the second gap and the second contact structure, and the second gap is between the first gap and the second contact structure.

20. The semiconductor device structure as claimed in claim 13, wherein the gap wraps around an upper portion of the gate dielectric layer.

* * * * *